US007226724B2

(12) United States Patent
Sato

(10) Patent No.: US 7,226,724 B2
(45) **Date of Patent: *Jun. 5, 2007**

(54) POSITIVE-TYPE PHOTOSENSITIVE COMPOSITION

(75) Inventor: Tsutomu Sato, Kashiwa (JP)

(73) Assignee: Think Laboratory Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/703,628

(22) Filed: Nov. 10, 2003

(65) Prior Publication Data

US 2005/0100816 A1 May 12, 2005

(51) Int. Cl.
*G03F 7/039* (2006.01)
*G03F 7/20* (2006.01)
*G03F 7/30* (2006.01)
*G03C 1/77* (2006.01)

(52) U.S. Cl. .................................... 430/307; 430/275.1

(58) Field of Classification Search ............. 430/270.1, 430/328, 280.1, 330, 905, 910, 909, 944
See application file for complete search history.

(56) References Cited

U.S. PATENT DOCUMENTS

| | | | | |
|---|---|---|---|---|
| 5,912,086 | A * | 6/1999 | Ando et al. | 428/500 |
| 5,932,392 | A | 8/1999 | Hirai et al. | |
| 5,942,368 | A * | 8/1999 | Akiyama et al. | 430/176 |
| 6,777,156 | B1 * | 8/2004 | Goto et al. | 430/270.1 |

FOREIGN PATENT DOCUMENTS

| | | | |
|---|---|---|---|
| EP | 1 449 675 A1 | | 8/2004 |
| JP | 3-255185 | * | 11/1991 |
| JP | 10-193552 A | | 7/1998 |
| JP | 2001-179924 A | | 7/2001 |
| JP | 2002-180021 | * | 6/2002 |
| WO | WO 02/41079 A2 | * | 5/2002 |

OTHER PUBLICATIONS

JPO English abstract for JP 03-255185.*
JPO English abstract for JP 2002-180021.*
EPO Communication dated Jul. 24, 2006 from European Patent Office for application No. 03 025 928.7—1251.
European Search Report dated Apr. 15, 2004.

* cited by examiner

*Primary Examiner*—Sin Lee
(74) *Attorney, Agent, or Firm*—Rader, Fishman & Grauer PLLC

(57) ABSTRACT

There is provided an alkaline soluble positive-type photosensitive composition having an infrared wavelength range laser sensitive characteristic. There is also provided a positive-type photosensitive composition not requiring any burning operation, capable of attaining a requisite and sufficient close fitness in coating operation under a condition of indoor working room humidity of 25 to 60%, capable of attaining a development not producing any residuals while keeping a high sensitivity, cutting it with a sharp contour, attaining a quite hard resist film and improving an anti-scar characteristic in a handling before developing operation. This composition includes an alkaline soluble organic high molecular substance having a phenolic hydroxyl group; photo-thermal conversion substance for absorbing infrared rays of an image exposure light source; and a close-fitness modifying agent such as polyvinylpolypirrolidone/polyvinylacetatecopolymer and the like.

2 Claims, 4 Drawing Sheets

POSITIVE-TYPE PHOTOSENSITIVE COMPOSITION

BACKGROUND OF THE INVENTION

1. Field of the Invention

There is provided an alkaline soluble positive-type photosensitive composition having an infrared wavelength range laser sensitive characteristic, in which the photosensitive part is exposed by a laser beam having a wavelength of about 700 to 1,100 nm and can be dissolved in developing liquid.

2. Description of the Related Art

The prior art traditional positive-type photosensitive lithography plate contains novolac resin and o-quinonediazide composition, a substance photosensitive to white light, this plate becomes a ketene structure while producing an Armdt-Eistert type transition through pholysis (chemical change) of o-quinonediazide as indicated in a chemical formula (1) as follows, produces five-membered ring carboxylic acid, ketene at an upper part of photosensitive layer at an exposed portion is reacted with naphthoquinonediazide at the lower part of the photosensitive layer to form lactone, this becomes sodium carboxylic acid while lactone ring is opened when a developing action occurs with alkaline aqueous solution, the coexisting novolac resin also shows elution because it is resoluble with alkali and in turn, the photosensitive layer non-yet exposed portion produces a coupling reaction together with the coexisting novolac resin, it becomes an alkali-resolution retardant and left as a resist image. In this way, if it includes o-quinonediazide composition, a substantial developing latitude can be attained.

In this case, the developing latitude can be defined as one in which a developing operation can be carried out while there is a difference between a time until the exposed portion is exposed to the developing liquid and the exposed portion is completely removed and a time in which a residual film rate at the non-exposed portion is sufficiently assured even if it is exposed to the developing liquid.

[Chemical formula 1]

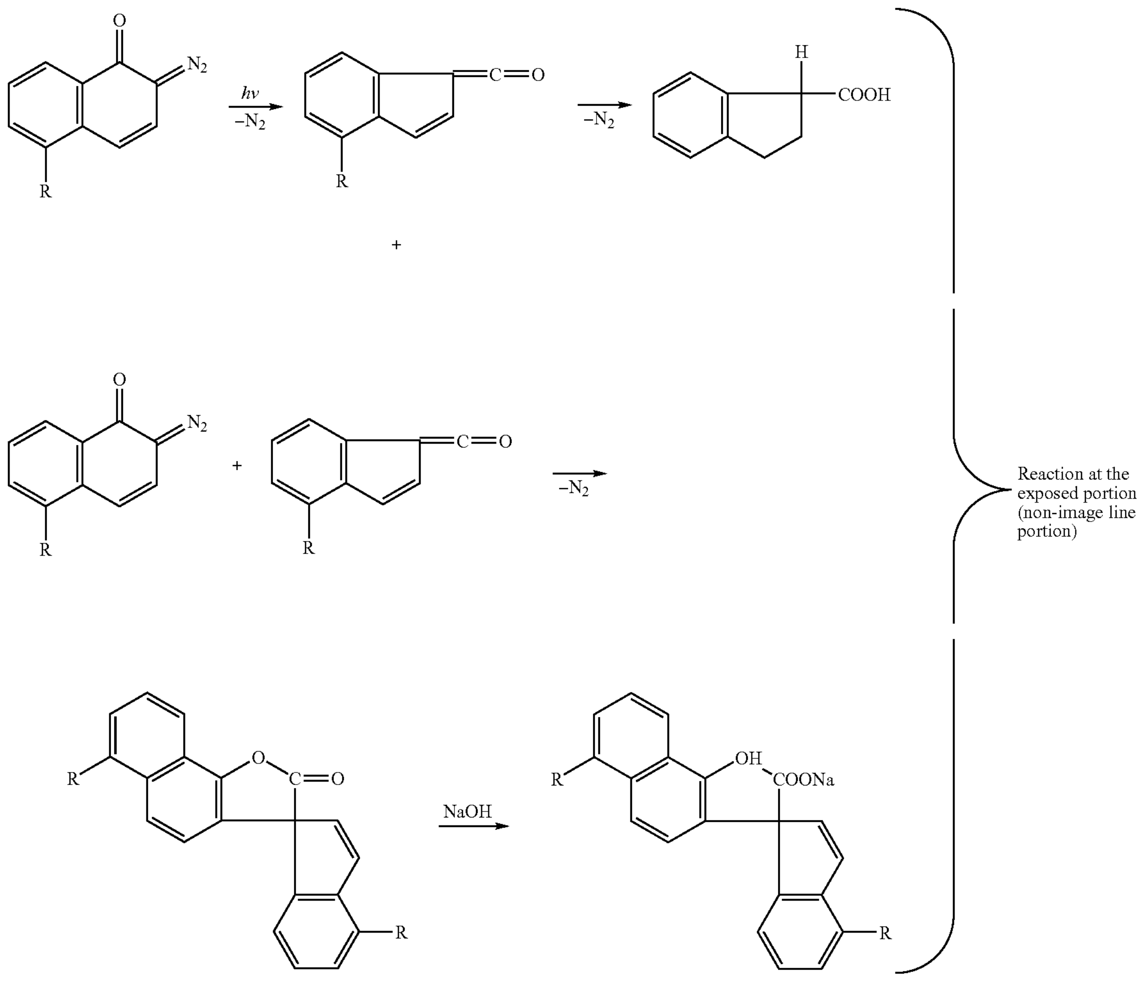

-continued

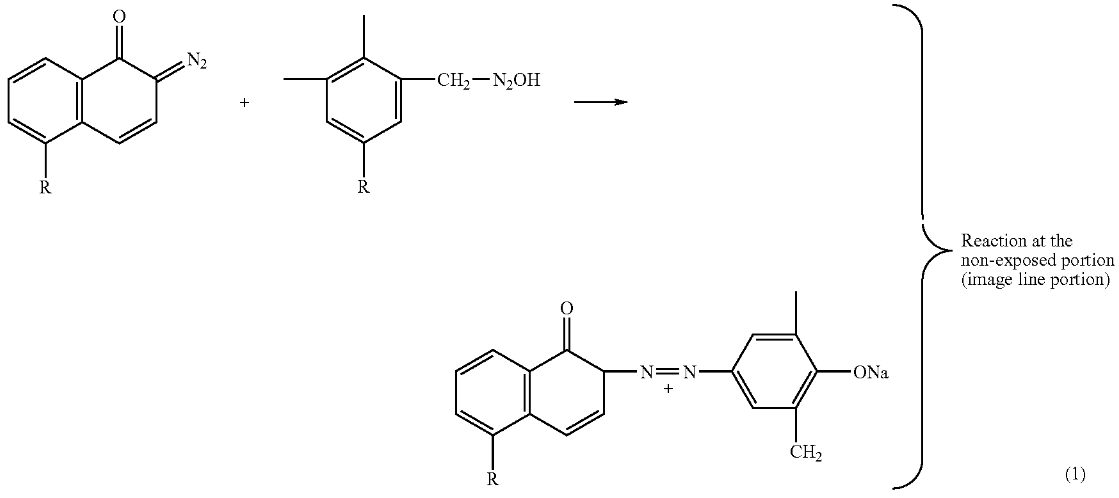

(1)

To the contrary, in order to enable a photogravure plate making to be carried out even under white light lamp, a positive-type photosensitive composition utilizing a change other than a chemical change has been invented, there has been devised to provide a method for printing a positive image with a laser light of infrared wave length region, increasing a solubility of the exposed portion against the developer liquid to form a positive image and thus this has been carried out through an offset plate making or a flexographic plate making. As the technical documents; there have been provided the gazettes of Japanese Patent Laid-open Numbers 1998(10)-268,512; 1999(11)-194,504; 1999 (11)-223,936; 1999(11)-84,657; 1999(11)-174,681; 1999 (11)-231,515; WO97/39,894; WO98/42,507;the gazettes of Japanese Patent Laid-Open Numbers 2002-189293; and 2002-189,295 and the like.

The positive-type photosensitive lithography plate described in each of the aforesaid documents has, as its major photosensitive component, substance absorbing infrared ray such as infrared absorbing pigment to convert it into heat and alkaline soluble resin such as novolac resin and the like, and a physical change such as conformation change of resin and the like is generated by heat produced by an infrared laser light exposed light and then solubility against developer liquid is increased.

However, the positive-type photosensitive lithography plate not containing o-quinonediazide composition, printing a positive image with a laser beam in an infrared wavelength range, producing a physical change such as conformation change of resin and the like to increase its solubility requires at present a burning process (a heating operation) after coating a film. Even if the burning process is carried out, a difference in dissolution speed between an exposed part and a non-exposed part is low, basic performances of a printing plate such as sensitivity and developing latitude are poor, so that it is hard to satisfy a stability in developing process when the number of plates for developing process is increased.

In regard to the aforesaid situation, this circumstance is quite different in the photogravure plate making process. In Japan where the photogravure plate making and printing technology has been mostly distributed in the industry, a photogravure plate making method capable of carrying out the photogravure plate making under application of positive-type thermal resist enabling a developing process to be performed under no heating after forming a coated film has not been performed in the prior art at all and there are no patent documents and experiment documents at all.

The photogravure plate making process for a plate-made roll through a corrosive/laser beam plate making method is comprised of loading→degreasing→washing→pickling→washing→ballade processing→washing→ balladecopper-plating→ washing→grinding with a grind stone→washing→coating of photosensitive agent→coating of antioxidant→image printing with infrared laser exposure device→developing→washing→etching→washing→resist peeling→washing→grinding→washing→unloading.

As technical documents disclosing the photogravure plate making process for a gravure plated roll by a corrosive/laser plate making process, some prior art documents can be cited, i.e. Japanese Patent Application Numbers 1998(10)-193551; 1998(10)-193552; Japanese Patent Laid-Open Numbers 2000-062342; 2000-062343; 2000-062344; 2001-179923; 2001-179924; 2001-187440; 2001-187441; 2001-191475; 2001-191476; 2001-260304; 2002-127369; 2002-187249; 2002-187250; 2002-200728; 2002-200729; 2002-307640; and 2002-307641.

All the photogravure plate making processes described in the aforesaid documents are carried out such that a photosensitive film composed of negative-type photosensitive composition agent is coated and the photosensitive film composed of positive-type photosensitive composition agent is not coated. In the prior art etching process, the negative-type photosensitive film is coated on the gravure-plated roll, the coated film is dried and solidified at a room temperature to form the negative-type photosensitive film, a printing is carried out with argon ion laser beam, and the prior art does not form a positive-type photosensitive film on the gravure-plated roll and does not perform a printing of the positive-type photosensitive agent image with a laser beam of infrared wave length.

A high-power semiconductor laser head manufactured by Creo-Scitex Corporation of Canada radiates a laser of infrared wavelength range, and this is installed at an offset printing machine to perform radiation against the positive-type photosensitive composition, a superior developing can be carried out and so this is practically operated in a world-wide basis.

When a beam diameter of argon ion laser beam and a beam diameter of laser beam with a wavelength of 700 to 1,100 nm are the same value to each other, a resolution of laser at the positive-type photosensitive composition is higher than that at the negative-type photosensitive composition and its processing time can be substantially reduced.

Further, a more superior clear pattern can be attained by the photosensitive film of positive-type photosensitive composition used for printing a negative image with argon ion laser rather than by the photosensitive film of negative-type photosensitive composition used for printing a negative image with argon ion laser. This is caused by a difference in clearness in pattern under a difference in the positive-type photosensitive composition and the negative-type photosensitive composition.

A reason why the positive-type photosensitive composition agent is used for the offset plate making or flexographic plate making in the prior art, but as not been used in the photogravure plate making consists in the fact that the negative-type photosensitive agent could be used in the late photogravure plate making. The negative-type photosensitive agent is material for use in radiating ultraviolet rays to fix a degree of polymerization of resin at the exposed portion, so that whatever material quality at the coated surface may be selected, a requisite and sufficient developing latitude can be assured.

In turn, the positive-type photosensitive composition agent having a developing latitude capable of being satisfied in relation with a copper sulfate plating at the photogravure printing roll was not present at all. In particular, because the photosensitive composition agent not performing any burning after coating was not present at all. Even if the positive-type photosensitive composition agent used in either the offset plate making or flexographic plate making is coated on the gravure-plated roll, a condition capable of forming film is scarcely present. In many cases, the coating film of the positive-type photosensitive composition agent for the photogravure plated roll is entirely flowed by the alkaline developing agent. This is similarly applied even in the case that the burning is carried out after coating.

A photogravure plate making system of high resolving power using the positive-type photosensitive film under application of either a semiconductor laser or YAG laser or the like capable of highly outputting a laser beam of infrared wavelength range is highly desired for its realization in reference to a small-sized device, an environmental light at the time of plate making operation, a resolving power and a clear pattern and the like as compared with the case in which an argon ion laser is used.

The present inventors et al. have started to develop the positive-type photosensitive composition agent having a requisite and sufficient developing latitude without performing any burning after coating in relation with the copper sulfate plating of a photogravure printing roll in view of the aforesaid circumstances.

Then, the present inventors et al. have made undiluted solution of the positive-type photosensitive composition mixed with novolac resin and cyanine pigment in reference to the etching process applied as one of the plate making methods for a photogravure printing roll and coated the positive-type photosensitive agent thinned by the solvent to the copper sulfate plating surface of the photogravure plated roll to form it. In the case of coating of the positive-type photosensitive agent, a photosensitive film coating device according to Japanese Kokoku Publication No. 1995(07)-109511 (manufactured by Think Laboratory Co., Ltd.) was used. Then, a laser of infrared wavelength range was radiated by an infrared laser exposing device (manufactured by Think Laboratory Co., Ltd.) having a high output semiconductor laser head of Creo-Scitex Corporation mounted therein to print the positive image, a developing test was carried out, resulting in that the photosensitive film was entirely removed and a satisfactory resist image could not be attained at all.

Evaluation of a formed film made by the photosensitive film coating device in accordance with Japanese Kokoku Publication No. 1995(07)-109511 showed that this prior art device is a spiral scanning system of contact coating type where the coating roll is immersed in the photosensitive agent in the tank, the photosensitive agent is coated by several times against the coated surface and it can be assumed that air is mixed with the photosensitive film, the tank is an opened structure, so that solvent in the photosensitive agent stored in the tank is evaporated to remove evaporating latent heat, the coating roll is cooled to generate a coating of whitening phenomenon, a concentration of the solvent is always decreased, viscosity is gradually increased and a coated film of uniform film thickness cannot be attained. As a result, the present inventors have concluded that the positive-type photosensitive agent film is quite improper even if the negative-type photosensitive agent is properly coated and the photosensitive film coating device according to Japanese Kokoku Publication No. 1995(07)-109511 makes a film.

In view of the foregoing, the present inventors have replaced with the photosensitive film coating device according to Japanese Kokoku Publication No. 1995 (07)-109511 and developed a photosensitive film coating device in which the solvent in the photosensitive agent in the tank is not evaporated in its sealingly closed state, the material can be coated on the gravure plated roll under no contacted state, and the coating accompanying with the whitening phenomenon can be avoided.

The photosensitive film coating device will be described in detail in the column of the preferred embodiment of the present invention.

In brief, as a method for coating the positive-type photosensitive agent to a gravure plated roll, the upper end of the photosensitive agent flowing-out pipe acting as a vertical pipe is approached to a lower surface of one end of the gravure plated roll chucked at both ends in a horizontal state and rotated, the photosensitive agent is supplied to overflow while being slightly bulged out at the upper end of the photosensitive agent flowing-out pipe, the photosensitive agent flowing-out pipe is moved from one end of the gravure plated roll to the other end thereof, the coating liquid is coated on the gravure plated roll by a spiral scanning system and the rotation of the roll is continued until the coated film shows an automatic drying.

In view of the foregoing, our continued study showed that a strong close contacted state of the positive-type photosensitive composition against the copper sulfate plated surface could not be attained and its developing operation caused the positive-type photosensitive composition to be rapidly eliminated with alkaline developing liquid for all the image lines and non-image lines.

Due to this fact, it could not be avoided that the burning operation for heating the film surface up to a high temperature after film coating is carried out and a close contacting force is applied.

A reason why it was necessary to perform the burning operation consisted in the fact that a film is not formed due to a quite poor close fitness of the positive-type photosensitive composition against the copper sulfate plating surface and the burning operation after film forming enables a hydrogen bond of alkaline soluble organic high molecular substance having a phenolic hydroxyl group to be increased and a close fitness to be improved.

Our continued study under an assumption that the burning operation is carried out at present showed that the positive-type photosensitive composition having the aforesaid manufactured novolac resin and cyanine pigment mixed to each other was coated on the gravure plated roll, the burning was carried out for 30 minutes to cause a film surface temperature to become 60° C., it was exposed with laser and developed, resulting in that a poor developed state was attained.

Thus, burning was carried out for 30 minutes in such a way that the film surface temperature becomes 130° C. Even under this state, a poor phenomenon occurred in which the image line as well as non-image line is entirely removed.

The present inventors concluded that a cause for producing a poor developed state even under performing the burning operation consisted in a too lower close fitness of the positive-type photosensitive composition against the copper sulfate plating.

Thus, as a result of increasing a close fitness force at the photosensitive film through inputting silane coupling adent as promoter for increasing a close fitness force to the positive-type photosensitive composition, both exposure and developing could be carried out in a little superior manner.

More practically, the gravure plated roll with a diameter of ϕ200 mm, for example, was rotated at a low speed of 25 r.p.m., the positive-type photosensitive agent was coated on it, its rotation was continued not to cause any liquid dripping, the photosensitive film having a degree of dry where the solvent is gasified to a state in which no liquid dripping occurs upon elapsing by 5 minutes under a natural drying condition was set, and after this operation, a residual concentration of solvent upon burning at 130° C. for 30 minutes was lower than 2%, the image could be printed by a laser and its developing operation could be carried out.

However, a close fitness against the film could be said as the best one and both exposure and developing did not exceed a little bit superior range.

In addition, it became apparent that when the film surface temperature was set to 130° C., theburning and its subsequent cooling required a time more than 100 minutes, a large amount of heat energy was required, its running cost was high and it showed a poor practical characteristic.

Additionally, when the film surfacetemperature was set to 130° C., hydrogen bond of alkaline soluble organic high molecular substance having a phenolic hydroxyl group was strengthened to cause a developing to be hardly carried out and at the same time, it was sensed from a poor clearness of pattern that cyanine pigment was denatured and its sensitivity was lowered.

Then, a superior observation about the resist image made it apparent that many pinholes were generated. In the case of the negative resist image, such pinholes as above were not produced. Reasons in regard to these phenomena consisted in the facts that a mere washing with water after precision grinding by a grinder stone did not enable ground powder adhered to the gravure plated roll to be completely washed away; if the plate making room was not made as a clean room of high degree, the powder dusts were adhered to the gravure plated roll during its transporting operation; and the positive resist image was more quite sensitive to the film making condition than that of the negative resist image.

Thus, occurrence of pinholes could be restricted by applying an sufficient wiping-off operation with a wiping cloth before coating the photosensitive agent to the gravure plated roll in reference to our various kinds of studying.

Next, the present inventors et al. have considered it important that a film surface temperature is lowered to eliminate a problem of specific heat capacity because as the photogravure plated rolls, there are present two types of rolls, i.e. one roll having aluminum as its base material and the other roll having iron as its base material, and additionally, their roll diameters are different from each other and different roll diameters cause their thickness to be entirely different, resulting in that even if they are heated by heater only for the same period of time in reference to a difference in specific heat capacity, heat is transmitted to the roll base materials and a film surface temperature is not always heated to 130° C. and disturbance where the rolls are heated to various different temperatures is produced.

The present inventors considered that the burning operation for substantially decreasing a concentration of solvent can be accomplished even if it is carried out under a far lower temperature than 130° C. by selecting composition showing a superior removal of solvent.

A test for reducing the heating time was carried out, a burning temperature for the film surface was decreased to 80° C. to 100° C. and the burning operation was carried out for 50 minutes, it was confirmed that a concentration of the solvent becomes 6% or less. However, this operation resulted in poor developing state. It has been concluded as its cause that the aforesaid silane-coupling agent cannot attain any requisite and sufficient adhesion.

Then, in place of silane-coupling agent acting as adherence agent, imidazole acting as hardening promoter was tried to be inputted. However, there was no specific change as for the case of silane-coupling agent and a burning temperature at the film surface was also the same as that of the silane-coupling agent.

Subsequently, the present inventors performed an experiment that various kinds of adherence agents are added against undiluted solution of the positive-type photo-sensitive composition composed of alkaline soluble organic high-molecular substance having phenolic hydroxyl group and photo-thermal converting substance for absorbing infrared rays of an image exposure light source and converting the infrared rays into heat, a photo-sensitive film is formed on the copper sulfate plating roll at a room temperature of 25° C., a test image is exposed by the aforesaid infrared laser exposure device (manufactured by Think Laboratory Co., Ltd.) to develop the film, resulting that a burning temperature for the photosensitive film of the positive-type photosensitive composition added with titanium organic compound could be remarkably decreased.

In the case of the photosensitive film of positive-type photosensitive composition added with titanium organic compound, the film could be made in a superior manner even at a burning temperature of 46° C., its sensitivity became superior and developing operation could be easily carried out.

However, a test not performing any burning operation could not attain any superiorfilm formation and a poor developing occurred.

Even if the burning temperature couldbe decreased approximately to 50° C., it became a disadvantage in reference to a necessity of performing the burning operation, a necessity of performing a cooling operation after burning operation, taking time and energy for the burning operation and its subsequent cooling operation, an extended length of a device line by a length of the burning device, an increased facility expenditure and an increased running cost. Thus, the present inventors considered that an elimination of the burning operation is a problem to be solved.

Performing a burning operation shows that the roll has a high thermal load differing from that of a thin plate member, it takes 30 to 60 minutes for being heated to a requisite temperature, it takes 50 to 100 minutes or longer for being cooled down to a room temperature and further a uniform control cannot be carried out because these times are made different in reference to a size of the roll. In addition, performing the burning operation causes the cyanine pigment to be denatured, its sensitivity to be decreased, a clear pattern to be deteriorated, a thickness of the resist to be thinned at the time of developing operation, its contour to be retracted and a cause of producing some pinholes to be generated.

Accordingly, a development of the positive-type photosensitive film not requiring any burning operation has been highly desired.

As a result of repetition of tests performed by several times, a high total concentration of residual solvent such as MEK, IPA, PM and the like at the time of making a film clarified that an image cannot be printed by a laser (either a principal chain or a side chain of molecules of photosensitive film forming resin at the exposed part is cut to cause them to become low molecules showing a more increased alkaline solubility and at the same time, a latent image under a state where the photosensitive layer is properly dispersed cannot be formed).

A residual concentration of solvent when the positive-type photosensitive agent was coated on the copper sulfate plating plate and upon elapsing of 15 minutes under a natural drying condition where no air blowing was carried out at a room temperature of 25° C. was 11%, and a residual concentration of solvent upon elapsing of 25 hours was 9%. Result of measurement upon elapsing of 10 minutes in which the positive-type photosensitive agent was coated on the photogravure plated roll rotated at 45 r.p.m. showed that a residual concentration of the solvent was merely decreased down to 7%.

Accordingly, in order to modify quality by containing promoter enforcing adherence power in the positive-type photosensitive agent, remake undiluted solution of the positive-type photosensitive film not requiring any burning operation and confirm its result through exposure and developing, it has been found apparent that it is necessary to devise in advance a technology capable of substantially reducing a residual concentration of solvent in compliance with the foregoing.

Then, the present inventors et al., for the first time set, as a theme of development, a practical application of the positive-type photosensitive film not requiring any burning operation, discriminated as a technical concept, both developments, i.e. one development of a film making and drying technology capable of substantially reducing a residual concentration of solvent in a short period of time and easily by another means not dependent on the burning operation after film formation, and the other development of the positive-type photosensitive film capable of substantially improving an adherence characteristic of the positive-type photosensitive film itself through adding of promoter strengthening the adherence power and showing a high developing latitude, and then continued the study so as to solve the former problem at first.

The present inventors have considered the fact that solvent volatilizes from the coated film. It is considered that a dispersion characteristic of the solvent present at the inner layer is decreased as the time elapses and the surface is dried more and more because the coated film contacts air to dry from its surface and increase its hardness and its tissue is fastened. In turn, it is considered that a degree in which the solvent volatilizes from the coated film is made different by a pressure of surrounding atmosphere, a degree of volatilization where the solvent volatilizes from the coated film is high under a negative pressure and the residual solvent can be effectively reduced. However, it is not possible to place the roll having a film coated thereon in a room vacuumed by a vacuum pump.

In view of the foregoing, the present inventors et al. rotated the photogravure plated roll at a high speed after no liquid dripping at the coated film and found that a residual concentration of the solvent can be decreased to 3% or less within a short period of time.

In view of the foregoing, the photogravure plated roll was supported at both ends in a horizontal state in the photosensitive film coating device in accordance with Japanese Patent Publication No. 1995(7)-109511, rotated at a predetermined low speed, test photosensitive liquid was uniformly coated by a spiral scan and non-contact coating system, the rotation was continued after this operation, the photosensitive film with such a degree of drying as one in which the solvent is volatilized not to cause any liquid dripping was set.

Subsequently, as a technology capable of substantially decreasing a concentration of solvent within a quite short period of time without performing any burning operation, the present inventors et al. have established a technology for attaining a formed film having a lower residual concentration of solvent capable of realizing an image printing characteristic with laser beam while the residual solvent in the film is dispersed and removed into air by rotating the photogravure plated roll at a predetermined high speed for a predetermined time, acting a centrifugal force against the residual solvent in the film and frictionally contacting the film surface with air.

Photosensitive liquid was uniformly coated on a test roll of $\phi$200 mm, its rotation was continued at 25 r.p.m. for 5 minutes upon completion of coating operation, and after this, the rotation was stopped, it was waited for 5 minutes, liquid dripping was observed, no liquid dripping was confirmed by naked eyes, the test roll was rotated at 100 r.p.m. for 20 minutes and stopped, a residual concentration of solvent in the photosensitive film was measured and its value was 2.3%.

Further, the technology capable of substantially decreasing the concentration of solvent within a quite short period of time without performing any burning operation has been developed, resulting in that the promoter for enforcing various kinds of adherence power was added, the positive-type photosensitive agent was exposed and developed and a study was continued whether or not the agent has a developing latitude.

As a result, titanium organic compound of at least one of cellulose derivative, titanium alkoxide, titanium acrylate, or titanium chelate was included in undiluted solution of positive-type photosensitive composition composed of alkaline soluble organic high-molecular substance having phenolic hydroxyl group and photo-thermal conversion substance for absorbing infrared rays of the image exposure light source and tested, resulting in that a burning processing caused a poor developing operation, no burning operation caused a superior developing state and the most superior resist pattern could be attained. At this time, a room temperature was 25 to 27° C. and a humidity was about 50 to 55%.

However, test carried out at a day having the highest air temperature of about 16° C. and a quite low humidity of 21 to 23% showed that the photosensitive film was entirely removed through developing operation.

It is known in the industry in general that the positive-type photosensitive agent has a humidity dependency in which it may generate a whitening phenomenon at a high humidity of 60% or more and a film cannot be formed.

However, the aforesaid result clarified that an adherence power of the positive-type photosensitive agent does not appear even under a low air temperature and a quite low humidity. Further, a reason why the whitening phenomenon is generated and a film cannot be formed could not be resolved.

Thus, a dehumidifier and a humidifier were installed in a casing of a photosensitive film coating device according to the aforesaid Japanese Patent Publication No. 1995(7)-109511 so as to control a humidity, subsequently, material for enforcing an adherence power more was completely searched, a small amount of material was added to form a film and a test for exposing and developing the film was carried out in sequence, resulting in that each of the positive-type photosensitive agents in which any of adherence characteristic reforming agents of (1) polyvinyl/polypyrrolidone/polyvinylacetate copolymers
(2) polyvinylbutyral
(3) styrene/maleic acid copolymers
(4) vinylpyrolidone/dimetylaminoetylmethacrylate copolymers
(5) terpolymer of vinylpyrrolidone/caprolactam/dimetylaminoetylmethacrylate
(6) terpenephenolic resin
(7) alkylphenolic resin
(8) polyvinylformar resin
(9) melamine/formaldehyde resin
(10) polyvinyl acetate, and
(11) ketone resin is mixed with and added with undiluted solution of alkaline soluble organic high molecular substance including epoxy resin having phenolic hydroxyl group or reacted with phenolic hydroxyl group and photo-thermal conversion substance for absorbing infrared rays of an image exposing light source and converting it into heat showed a high developing latitude.

Describing it in detail, the photogravure plated roll of ϕ200 mm plated with copper sulfate was supported at both ends at a photosensitive film coating device and rotated at 25 r.p.m. under a condition in which a room temperature in an experiment room was 25° C. and a humidity in the casing of the photosensitive film coating device was changed to 25%, 30%, 55% and 60%, respectively, the roll was wiped off with a wiping cloth, the positive-type photosensitive agent was correspondingly coated, and also after completion of coating operation, the rotation was continued to prevent liquid dripping from being carried out, the film was formed upon elapsing of 5 minutes under a natural drying condition, and then the roll was rotated at 100 r.p.m. for 10 minutes, the residual solvent was reduced and its rotation was stopped.

All the photogravure-plated rolls taken out of the photosensitive film-coating device could be attained as tested rolls having luster, coated and formed with a quite hard photosensitive film showing luster and having quite high adherence power.

Film thickness of the resist was about 3.5 to 3.8 μm. Measurement of a residual concentration of solvent showed that all the test rolls showed about 2.3%.

Then, the test image was exposed (the image lines were exposed) with a laser of infrared wavelength range by the aforesaid infrared laser-exposing device (manufactured by Think Laboratory Co., Ltd.), then it was developed with alkali, resulting in that non-image line part generated a film reduction dissolved out. However, in all the cases, a quite sharp resist pattern having no residues was attained when it was immersed in the alkali developing liquid for 60 to 70 seconds. Then, it could be confirmed that the resist pattern naturally dried after elapsing a certain time upon developing action is quite hard. A film thickness of the resist film after developing operation was about 1.8 to 2.5 μm. No pinholes caused by the film reduction were generated.

With the foregoing, the present invention has been developed.

SUMMARY OF THE INVENTION

This invention is related to a positive-type photosensitive composition in which the photosensitive part exposed by a laser beam having a wavelength of 700 to 1,100 nm. It can be dissolved in an alkaline developing liquid, and has the object of providing a positive-type photosensitive composition having the following effects:

no burning after coating is necessary and a requisite and sufficient adhesion to aluminum can be attained when the coating is carried out with a humidity of 25 to 60% in a working room;

further, in particular it has a characteristic capable of attaining a requisite and sufficient adhesion state to not only aluminum but also copper or copper sulfate plating which are required far and away stronger adhesion compared with aluminum;

a superior alkaline developing not producing any residuals can be carried out in a suitable time, approximately 60 to 70 seconds;

no burning processing enables a quite superior developing to be carried out where a high sensitivity can be kept, and an edge of the resist image is cut in a sharp contour strictly in accordance with an exposure radiation pattern;

a quite superior developing can be carried out while a few film reduction is produced. It is possible to avoid occurrence of pinholes caused by film reduction;

the resist image has a luster, a quite hard resist image capable of printing several thousand copies can be attained during printing as it is, and anti-scar characteristic in handling before developing operation after forming the photosensitive film is improved; and a printing of image with laser and developing latitude are superior.

The problems to be solved by this invention described in claim 1 are to provide the positive-type photosensitive composition, which comprises alkaline soluble organic high molecular substance including epoxy resin having phenolic hydroxyl group or reacted with phenolic hydroxyl group and photo-thermal conversion substance for absorbing infrared rays of an image exposing light source and converting it into heat, and as adherence characteristic reforming agents, the composition includes any one of (1) polyvinyl polypyrrolidone/polyvinylacetate copolymers (2) polyvinylbutyral
(3) styrene/maleic acid copolymers
(4) vinylpyrolidone/dimetylaminoetylmethacrylate copolymers
(5) terpolymers of vinylpyrrolidone/caprolactam/dimetylaminoetylmethacrylate
(6) terpenephenolic resin
(7) alkylphenolic resin
(8) polyvinylformar resin
(9) melamine/formaldehyde resin
(10) polyvinyl acetate, and
(11) ketone resin.

The positive-type photosensitive composition of this invention has the photosensitive part is exposed by a laser beam having an infrared wavelength, and can be dissolved in an alkaline developing liquid. And the following superior the effects of the positive-type photosensitive composition are attained:

(1) Burning after coating of a photogravure-plated item is not suitable and it has a characteristic capable of attaining a requisite and sufficient adhesion state even if the burning is not carried out. A photosensitive film having luster and quite hard state can be attained.

(2) A requisite and sufficient adhesion can be attained when the coating is carried out on a fine day showing a humidity of about 25 to 60% in a working room, or the coating is carried out with a humidity of about 25 to 60% in the working room under application of the dehumidifying device and the humidifying device.

(3) A superior alkaline developing not producing any residuals can be carried out in a suitable time. Irrespective of the fact that the component at the photosensitive layer does not produce substantially any chemical change by exposure, all the basic performances of a printing plate such as an plate wear characteristic, sensitivity and developing latitude (balance between time exposed portion is completely removed when developing and one rate of remaining film of non-exposed portion is fully secured, when developing) can be satisfied.

(4) Even if the image exposure is carried out with a lower exposure energy rather than with a higher exposure energy in which excessive heat is generated by the photo-thermal conversion substance in the photosensitive layer, the developing latitude can be set wide, so that a degree of dispersion generated at the photosensitive layer is well restricted low and there occurs no problem that the photosensitive layer is dispersed and the optical system in the exposure device is contaminated.

(5) No burning processing enables a quite superior developing to be carried out where a high sensitivity can be kept, and an edge of the resist image is cut in a sharp contour strictly in accordance with an exposure radiation pattern.

(6) A quite superior developing can be carried out while a film reduction is scarcely produced. It is possible to avoid occurrence of pinholes caused by film reduction.

(7) The resist image has a luster, a quite hard resist image capable of printing several thousand copies can be attained during printing as it is, and anti-scar characteristic in handling before developing operation after forming the photosensitive film is improved.

(8) A printing of image with laser and developing latitude are superior.

Although it is preferable that the positive-type photosensitive composition in accordance with the present invention is used for forming a positive-type photosensitive film on a copper sulfate plated surface of a photogravure plated roll for a photogravure printing operation, this composition is not limited to this application, and even if this composition is applied to a plate of metals such as aluminum, zinc and steel or the like; a metallic plate plated with or vapor deposited with aluminum, copper, chromium and nickel or the like; paper coated with resin; paper adhered with metallic foil such as aluminum or the like; a plastic film; a hydrophilized plastic film; and a glass plate, it shows a superior close fitness at a low temperature and a high sensitivity can be attained.

Accordingly, it can be preferably used for a printing plate of photosensitive lithography, a proof for a convenient proof printing, a wire circuit board or a photogravure copper etching resist, a color filter resist used in manufacturing a flat display unit and a photo resist for manufacturing an LSI or the like.

DETAILED DESCRIPTION OF THE PREFERRED EMBODIMENTS

Figure 1:
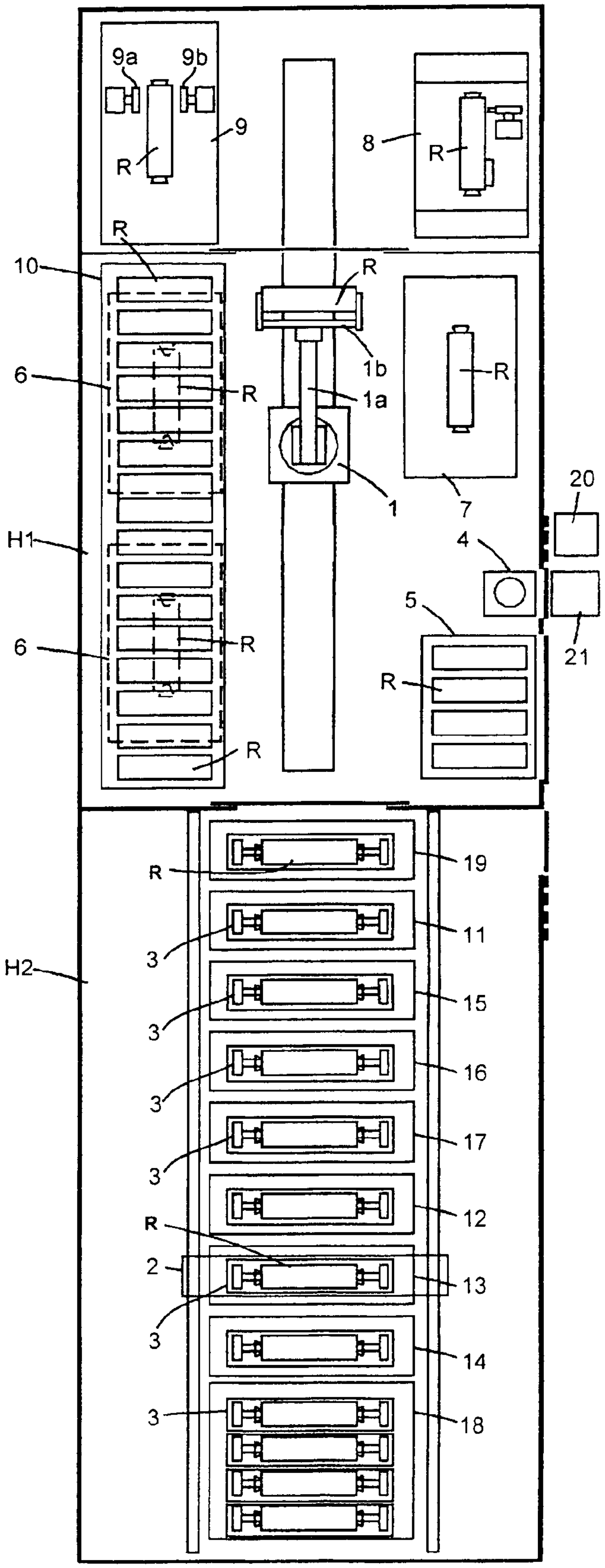
FIG. 1 is a schematic top plan view for showing a photogravure plate-making device for performing a photogravure plate making method.
Figure 2:
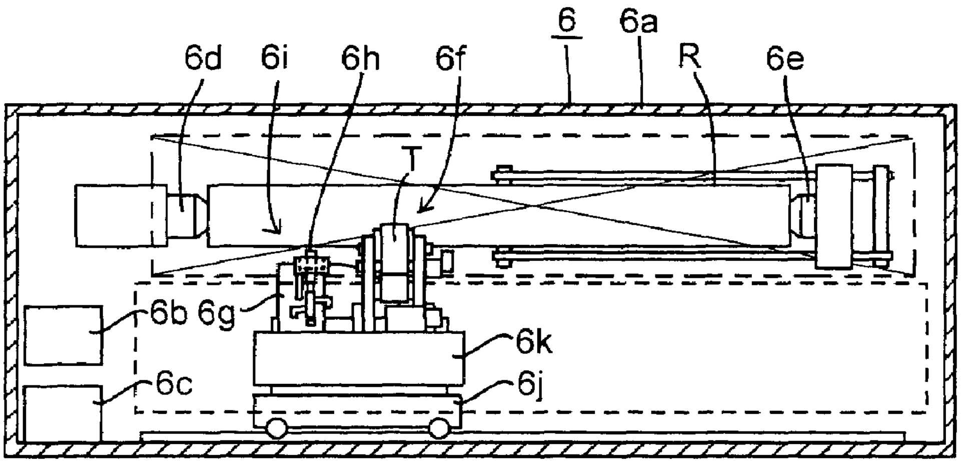
FIG. 2 is a front elevational view for showing a photosensitive film-coating device.
Figure 3:
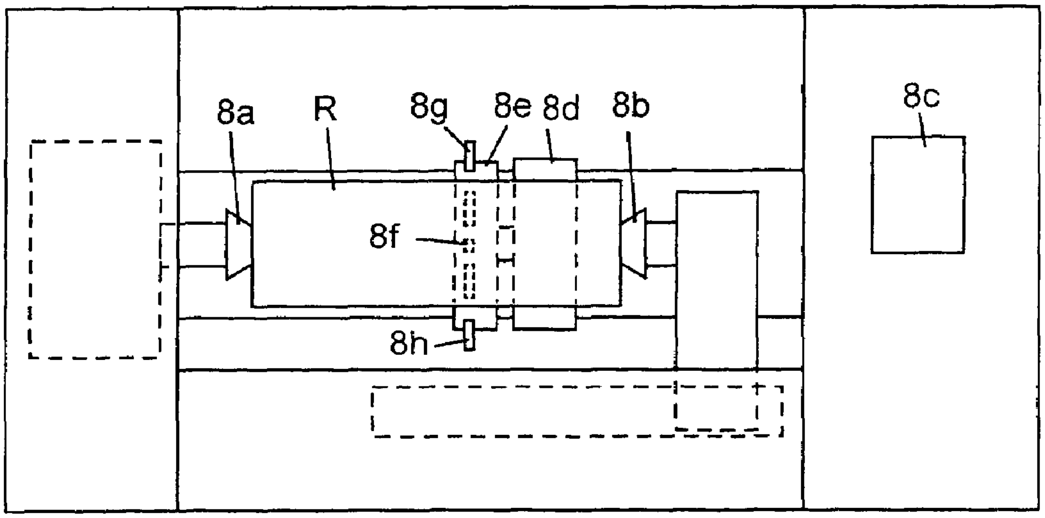
FIG. 3 is a front elevational view for showing an NC lathe.
Figure 4:
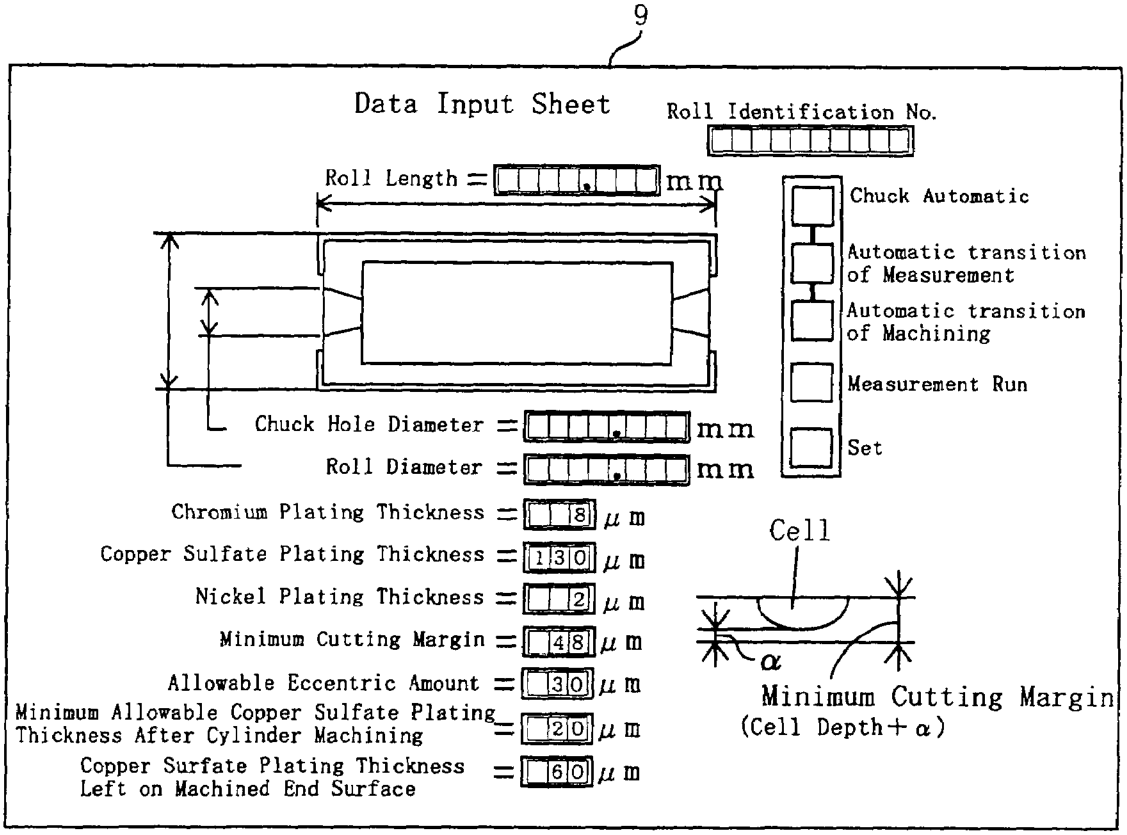
FIG. 4 is a display screen expressing input values or measured values or calculated values such as a cutting margin and the like for use in performing a precision cylinder machining through an NC lathe.
Figure 5:
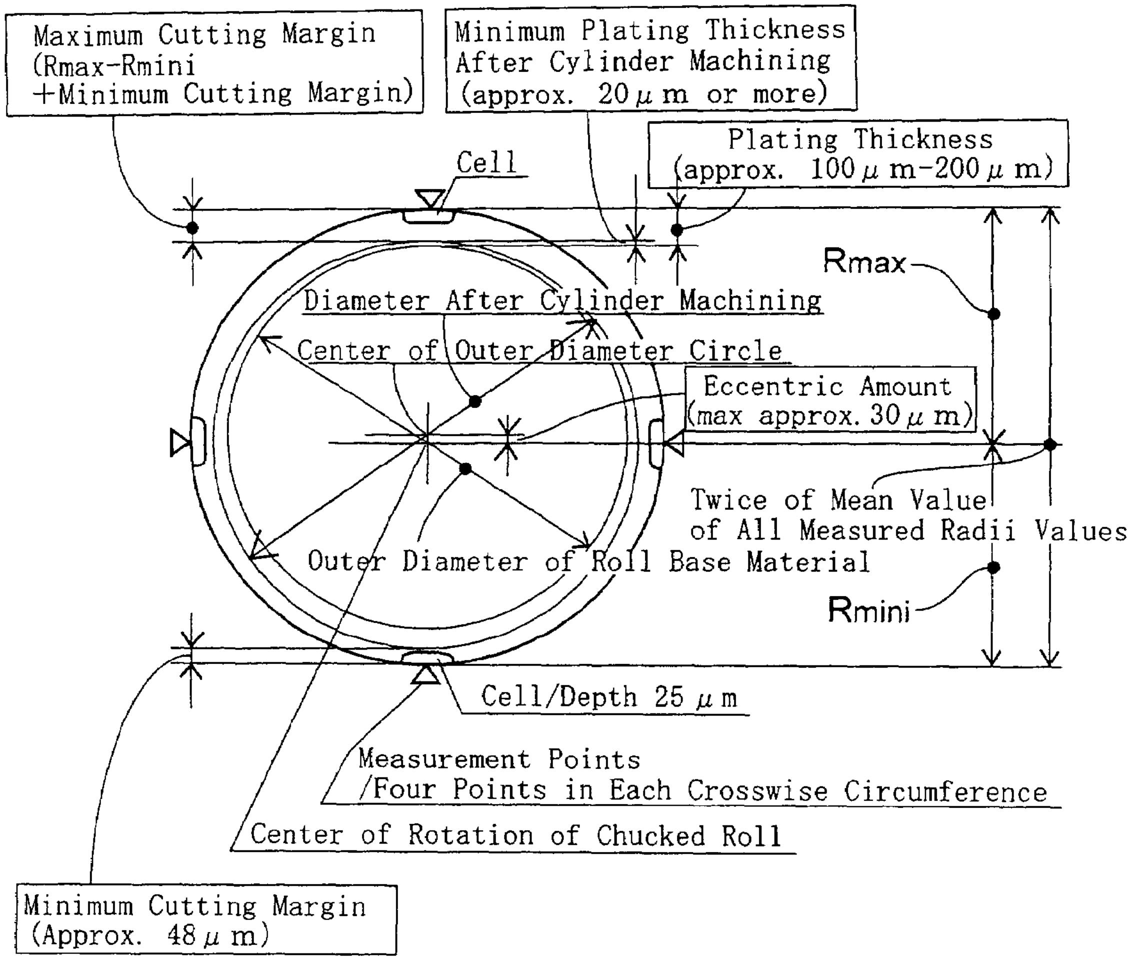
FIG. 5 is a view for expressing, through a roll sectional surface, a relation of input values or measured values or calculated values such as a cutting margin and the like for use in performing a precision cylinder machining through an NC lathe.

The problems to be solved by this invention described in claim 1 provides is obtained by the positive-type photosensitive composition, which comprises alkaline soluble organic high molecular substance including epoxy resin having phenolic hydroxyl group or reacted with phenolic hydroxyl group and photo-thermal conversion substance for absorbing infrared rays of an image exposing light source and converting it into heat, and as adherence characteristic reforming agents, the composition includes any one of
polyvinyl polypyrrolidone/polyvinylacetate copolymers
polyvinylbutyral
SM type copolymers
vinylpyrolidone/dimetylaminoetylmethacrylate copolymers or
terpolymers of vinylpyrrolidone/caprolactam/dimetylaminoetylmethacrylate
terpenephenolic resin
alkylphenolic resin
polyvinylformar resin
melamine/formaldehyde resin
polyvinyl acetate, and
ketone resin.

It may also be applicable that the positive-type photosensitive compound contains either developing promoter or dissolution suppressor.

[0065]-0038

It is preferable that a rate of inclusion of solid substance of the alkaline soluble organic polymer substance having phenolic hydroxyl group in the positive-type photosensitive composition is 80 to 96 wt % and it is further preferable that this value is 90 to 94 wt %.

It is preferable that a rate of inclusion of solid substance of the photo-thermal conversion substance in the positive-type photosensitive composition is 1 to 10 wt % and it is further preferable that this value is 2 to 4 wt %.

It is preferable that a rate of inclusion of solid substances in polyvinylpolypirrolidone/polyvinyl acetate copolymers or the like as alkaline soluble resin is 1 to 10 wt % and further it is preferable that this value is 2 to 4 wt %.

The positive-type photosensitive composition of the present invention is used under its thinned state in solvent. A rate of use of solvent in this case is normally in a range of about 1 to 20 times in regard to a total amount of photosensitive composition by its weight ratio.

As the alkaline soluble organic polymer substance having phenolic hydroxyl group, novolac resin, resol resin, polyvinyl phenolic resin, copolymers of acrylic acid derivative having phenolic hydroxyl group, alkaline soluble epoxy resin having epoxy resin reacted with phenolic hydroxyl group or the like and additionally alkaline soluble organic polymer substance having phenolic hydroxyl group described in Japanese Patent Laid-Open No. 1999-231515 can be applied as they are and in particular, novolac resin or polyvinyl phenolic resin is preferably applied.

Novolac resin is resin where at least one of phenols is polycondensated with at least one of aldehydes or ketones under a presence of acid catalyst. In particular, this is a polycondensation material of mixed phenols composed of m-cresol, p-cresol, 2,5-Xylenol, 3,5-Xylenol, and resorcinol, or mixed phenols composed of phenol, m-cresol and p-cresol and formaldehyde, and weight-average molecular weight (MW) reduced by polystyrene through a gel permeation chromatography measurement is preferably 1,500 to 10,000.

Resol resin is resin polycondensated in the same manner except application of alkaline catalyst in place of acid catalyst in a polycondensation of novolac resin.

Polyvinylphenol resin is resin where either one or more than two kinds of hydroxystyrenes, for example, are polymerized under a presence of radical polymerization initiater or cation polymerization initiater. It is preferable to apply polymer of hydroxystyrenes having alkyl group with the number of carbon being 1 to 4 applied as substituent on benzene ring or polymer of hydroxystyrenes having benzene ring without any substitution.

The photo-thermal conversion substance has an absorbing region at a part of or an entire of an infrared wavelength range with a wavelength of 700 to 1,100 nm, has a characteristic for absorbing laser beam in the infrared wavelength region to perform a thermolysis and contributes to an alkaline soluble low molecular formation and abrasion caused by thermal cutting of molecules of the alkaline soluble organic polymer substances having the aforesaid phenolic hydroxyl group. An increased or decreased amount of added volume of the photo-thermal conversion substances is related to an excessive amount and a poor amount of heat generated through exposure, a strong state or weak state of the infrared laser beam is related to an excessive or poor thermolysis of the alkaline soluble organic polymer substance present at the exposed portion, so that it is set to an appropriate amount.

As the photo-thermal conversion substance, organic or non-organic pigment or dyestuff, organic pigment, metal, metal oxide, metal carbide, metal boride or the like and photo-thermal conversion substance described in Japanese Patent Laid-Open No. 1999(11)-231515 having an absorbing region at a part of or entire infrared range with a wavelength of 700 to 1,100 nm can be totally applied as they are. Heterocycles or the like including nitrogen atom, oxygen atom or sulfur atom and the like are combined by polymethine (—CH═)n, widely-defined so-called cyanine type pigment can be applied as a typical one and more practically, for example, quinoline type (so-called "cyanine type"), indole type (so-called indocyanine type), benzothiazole type (so-called "thiocyanine type"), iminocyclohexadiene type (so-called "polymethine type"), pyrylium type, thiapyrylium type, squarylium type, chloronium type, azulenium type or the like can be applied, and in particular, quinoline type, indole type, benzothiazole type, iminocyclohexadiene type, pyrylium type, or thiapyrylium type are preferable. More particularly, phthalocyanine or cyanine is preferable.

As solvent, no specific limitation is required if solvent substance has a sufficient solubility against applied component and providing a superior film coating characteristic, Cellosolve type solvent, propylene glycol type solvent, ester type solvent, alcoholic type solvent, ketone type solvent and high polar solvent can be applied.

As Cellosolve type solvent, methyl cellosolve, ethyl cellosolve, methyl cellosolve acetate, ethyl cellosolve acetate and the like can be applied.

As propylene glycol type solvent, propylene glycol monomethyl ether, propylene glycol monoethyl ether, propylene glycol monobutyl ether, propylene glycol monomethyl ether acetate, propylene glycol monoethyl ether acetate, propylene glycol monobutyl ether acetate and dipropylene glycol dimethyl ether and the like can be applied.

As ester type solvent, butyl acetate, amyl acetate, ethyl butyrate, butyl butyrate, diethyloxolate, pyruvic acid ethyl, ethyl-2-hydroxybutylate, ethyl acetoacetate, lactate methyl, lactate ethyl, 3-methoxypropioni acid methyl or the like can be applied.

As alcoholic solvent, heptanol, hexanol, diacetone alcohol, furfuryl alcohol or the like can be applied.

As high polar solvent, ketone type solvents such as cyclohexanone, methyl amylketone, dimethyl formamide, dimethylacetamide, N-methylpyrrolidone or the like can be applied.

Additionally, acetic acid, or mixed solvent of these components and solvent added with aromatic hydrocarbon can be applied.

It may also be applicable that the positive-type photosensitive compound contains either developing promoter or dissolution suppressor.

It is preferable that a small amount of dicarboxylic acid or amines or glycols, for example, is added to the developing promoter.

As the dissolution suppressor, acid coloring pigment having lactone structure is preferable. This dissolution suppressor has a function for forming a hydrogen coupling with alkaline soluble organic polymer substance to reduce a solubility of the polymer substance in order to increase a time lag for solubility in respect to alkaline developing liquid at the exposed part and the non-exposed part and further has a function scarcely absorbing light at infrared region and not dissolved with light in the infrared region.

As other dissolution suppressors, there may be applied acid coloring pigments having thiolactone structure, N,N-diarylamide structure and diarylmethylimino structure, basic coloring pigment having sulfolactone structure, non-ionic surface active agent or the like such as sulfonate, phosphate, aromatic carboxylate, aromatic disulfonic acid, carboxylic acid anhydride, aromatic ketone, aromatic aldehyde, aromatic amine, aromatic ether and the like.

The positive-type photosensitive composition of the present invention is normally applied as a positive-type photosensitive film formed with a photosensitive composition layer at a surface of a supporting member by a method wherein solution having each of the aforesaid components dissoluted in solvents such as Cellosolve type solvent, propylene glycol type solvent is coated on either a copper plating surface or a copper sulfate plating surface of the photogravure plated roll for a photogravure printing operation acting as a surface of the supporting member, naturally dried and then the roll is rotated at a high speed, air is whistled at the surface of the photogravure plated roll, a mass action caused by a centrifugal force in the photosensitive film and a slight negative pressure state near the surface cause the residual concentration of the solvent to be reduced to 6% or less.

Although it is preferable to use the device 6 for coating a photosensitive film that is a fountain coat shown in FIG. 1 as a coating method, this method is not limited to it. It is also possible to use a meniscus coat or a dip coat attained by a vertical dip coating device. A thickness of the coated film can be set in a range of about 1 to 6 μm and it is preferable to set it in a range of about 3 to 5 μm.

As a light source for use in exposing an image at a positive-type photosensitive composition layer, it is preferable toapply either a semiconductor laser or an YAG laser producingan infrared laser beam with a wavelength of about 700 to 1,100 nm. In addition, it is also possible to use a solid laser such as a ruby laser and an LED or the like.

It is preferable that a beam intensity of the laser light source is 2.0×106 mJ/s.cm2 or more and it is especially preferable that its value is 1.0×107 mJ/s.cm2 or more.

As the developing liquid used for a photosensitive film formed under application of the positive-type photosensitive composition of the present invention, it is preferable to apply developing agent composed of either a non-organic or organic alkali such as non-organic alkali, salts of Na, K, or organic alkali, TMAH, or choline and the like. In the case of an experiment, as the developing liquid, original developing liquid containing (a) orthosilicate soda (b) phosphoric tersoda etc. (c) surface active agent and the like was applied.

The developing operation is normally carried out through an immersion development, spray development, brush development and ultrasonic development or the like at a temperature of about 15 to 45° C. and preferably at a temperature of about 27 to 32° C.

[Development Latitude of the Positive-type Photosensitive Composition]

The development latitude of the positive-type photosensitive composition is attained by the phenomena that (1) a coupling degree of films is appropriate, either the main chain or the side chain of molecules is cut at the exposed portion through exposure of the infrared laser beam, a physical change such as a conformation change to cause the molecule to become low molecules showing a more increased alkaline solubility as well as an appropriate dispersion ablasion of the photosensitive layer is generated to produce a thin film and the molecule is changed to be dissoluted in the alkaline developing liquid within a short period of time; and (2) the non-exposed portion is not dissoluted for a relative longer period than that of the exposed portion until it is dissoluted with alkaline developing liquid even if a slight variation occurs in temperature and humidity, and is strongly and closely adhered to the coated surface.

The developing latitude cannot be attained under the fact that if adhesion of the material (close fitness reforming agent) enforcing the close fitness is strong, weak adhesion of the alkaline soluble organic polymer substances having a phenolic hydroxyl group can be reinforced. Realization of adhesion caused by the material enforcing close fitness at the positive-type photosensitive composition is relatively determined in reference to both a type and an adding amount of material enforcing the close fitness.

For example, in the case of the positive-type photosensitive composition having titanium alkoxide selected as material enforcing a close fitness and a large amount of titanium alkoxide added, a strength, stability and close fitness of the entire film become too strong after burning operation, resulting in that a physical change such as a conformation change caused by exposure of the infrared laser beam or dispersion at the photosensitive layer (ablasion) is not generated, and even if the developing operation is carried out, the exposed portion is scarcely dissoluted in the developing liquid and an entire film is not decreased. That is, the developing latitude cannot be attained at all.

As an added amount is reduced gradually, the film is decreased and an area where the developing latitude can be attained is slightly produced, but a slight difference in room temperature or humidity causes the developing latitude not to be attained at once.

In turn, even if a silane-coupling agent is added to the alkaline soluble organic polymer substance having phenolic hydroxyl group, strong adhesion cannot be attained, there occurs no difference between one time in which the positive-type photosensitive composition layer at the exposed portion is dissoluted in the alkaline developing liquid and the other time in which the positive-type photosensitive composition layer at the non-exposed portion is dissoluted in the alkaline developing liquid, and they occur concurrently and the developing operation cannot be attained.

Further, the following positive-type photosensitive composition is made under acondition of a room temperature of 25° C. and humidity of 25 to 60%, the composition is coated on a copper surface or a copper sulfate plated surface, a concentration of the residual solvent is 6% or less, a superior developing operationcapable of attaining a sharp pattern not producing any residuals in about 60 to 70 second can be carried out.

The most superior developing latitude is realized when vinylpirrolidone/dimethylaminoethylmethacrylate copolymers and the like is contained by about 3% for its solid substance rate.

[Positive-type Photosensitive Composition of the Present Invention]

The positive-type photosensitive composition of the present invention contains an alkaline soluble organic polymer substance having epoxy resin with a phenolic hydroxy group or reacted with phenolic hydroxy group, and a photothermal conversion substance for absorbing infrared rays of an image exposing light source and converting it into heat, and further as a close fitness reforming agent, there will be mixed with and added by any one of the following substances, i.e. polyvinylpolypirrolidone/polyvinylacetate copolymers, polyvinylbutyral, stylene/maleic acid copolymers, vinylpyrrolidone/dimethylaminoethylmethacrylate copolymers, vinylpyrrolidone/caprolactam/dimethylaminoethylmethacrylate terpolymer, polyvinylformal resin or terpene phenolic resin or alkylphenolic resin, melamine/formaldehyde resin, polyvinyl acetate or ketone resin.

[Chemical formula 2]

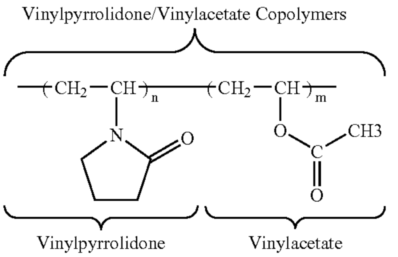

(2)

[Chemical formula 3]

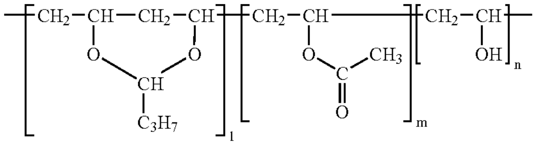

(3)

[Chemical formula 4]

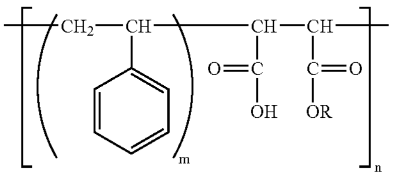

(4)

[Chemical formula 5]

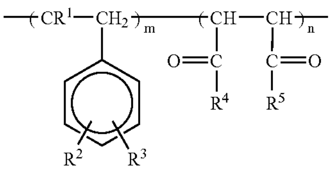

(5)

[In the formula (5), R1 denotes either a hydrogen atom or a methyl group, R2 denotes a hydrogen atom, hydroxy group, alkyl group or alkoxy group, R3 denotes either a hydrogen atom or a hydroxyalkyl group, R4 and R5 denote independently a hydrogen atom, lower alkyl group or group having reactive double-bond, m and n denote integer more than 1 and m≧n]

[Chemical formula 6]

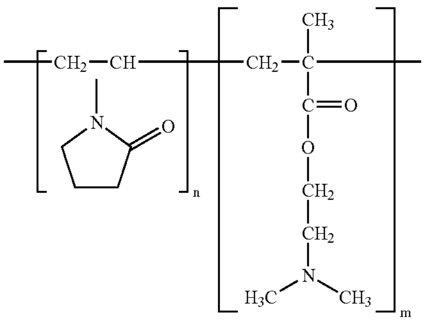

(6)

-continued

[Chemical formula 7]

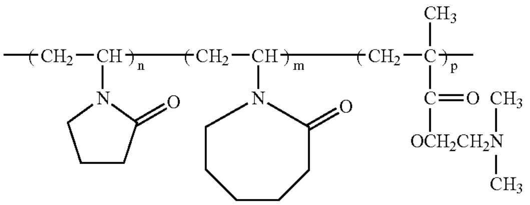

(7)

[Chemical formula 8]

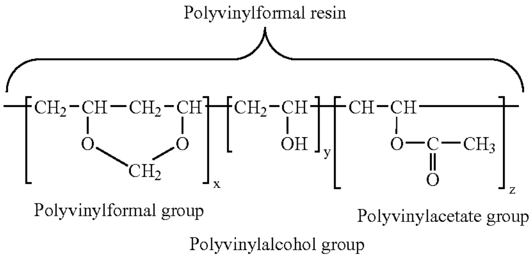

(8)

[Chemical formula 9]

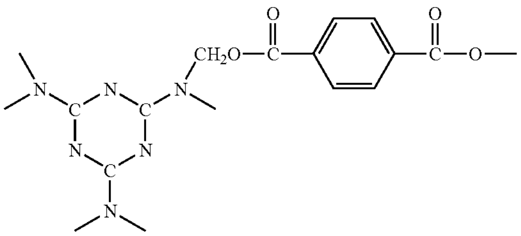

(9)

[Chemical formula 10]

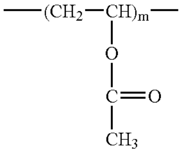

(10)

[Chemical formula 11]

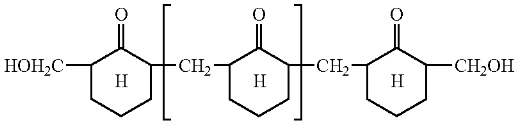

(11)

[Chemical formula 12]

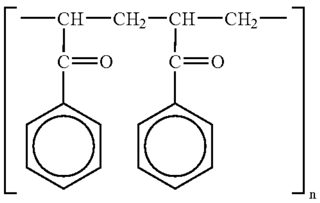

(12)

[Chemical Formula 2] indicates polyvinylpolypyrrolidone/polyvinylacetate copolymer.

PVP/VA copolymers (Vinylpyrrolidone/Vinylacetate Copolymers) are transparent thermoplastic linear random copolymers in which vinylpyrrolidone and vinylacetate are free radical polymerized with a rate of 70/30 to 30/70, molecular weight is 20,000 to 50,000, and hydrophilicity is increased as a rate of vinylpyrrolidone is increased.

PVP/VA copolymers are preferably made such that vinylpyrrolidone and vinylacetate have a rate of 60/40, a molecular weight in this case is 45×103 and Tg is 110° C.

[Chemical Formula 3] indicates polyvinylbutyral.

Polyvinylbutyral:

Existing chemical substance No. 6-708 is substance attained by butyral formation where butylaldehyde is reacted with polyvinylalcohol, a substantial amount of hydroxy group and acetyl group is left and this is indicated by a structure denoted by a following general formula.

As PVB, there are many products, such as Denka butyral 5000A, 6000EP manufactured by Denki Kagaku Kogyo Kabushiki Kaisha; products of Sekisui Kagaku Kogyo Co., Ltd. BL-1, BL-2, BL-2, BL-S, BX-L of low polymerization degree type; BM-1, BM-2, BM-5, BM-S of middle polymerization degree type; BH-3, BH-S, BX-1, BX-2, BX-5, BX-55 of high polymerization degree, and it is preferable in reference to a result of experiment that BL-S, BM-S and BH-S having solubility in various kinds of solvent are used.

[Chemical Formula 4] and [Chemical Formula 5] indicate stylene/maleic acid copolymers.

Styrene/maleic acid copolymers are copolymers of styrene and maleic acid.

Styrene/maleic acid copolymers indicated in the formula (4) have a product name Oxilack SH-101, copolymers of styrene and maleic acid semi-ester. It is preferable to use product in which maleic acid semi-ester is adjusted in styrene solution with an acid value of 60 to 90under an alcoholic reaction.

As styrene/maleic acid copolymers indicated in the formula (5), there may be present copolymers in which styrenes such as styrene, α-methystyrene, m or p-methoxystyrene, p-methylstyrene, p-hydroxysturene, 3-hydroxymethyl-4 hydroxy-styrene or its derivative (styrene type monomer), and maleic acid derivatives such as maleic anhydride, maleic acid, maleic acid monomethyl, maleic acid monoethyl, maleic acid mono-n-propyl, maleic acid mono-iso-propyl, maleic acid mono-n-butyl, maleic acid mono-iso-butyl, maleic acid mono-tert-butyl and the like are copolymerized (hereinafter called as a "copolymer (a)"). As the copolymer (a), although not indicated in the aforesaid structural formula, there may be present methylmethacrylate, alkylmethacrylate such as t-butylmethacrylate, alkylacrylate, or the aforesaid copolymer (a) are denatured by compound having a reactive double-bond (hereinafter called as copolymer (b)). m and n in this case are integers more than 1 and have a relation of $m \geqq n$, and preferably m/n=1 to 1.1. As a weight-average molecular weight, a value of 1,500 to 100, 000 is preferable.

The aforesaid copolymer (b) can be manufactured by a method wherein either acid anhydride group or carboxy group in the copolymer (a) is reacted with unsaturated alcohols, for example, allyl alcohol, 2-butene-1-2-ol, furfuryl alcohol, oleyl alcohol, cinnamic alcohol, 2-hydroxyethylacrylate, hydroxyethylmethacrylate, N-methylolacrylamide; and epoxy compound having each of one oxilane ring and reactive double-bond such as glycidilacrylate, glycidilmethacrylate, allylglycidilale, α-ethylglycidilacrylate, crotonilglycidilether, itaconic acid monoalkylmonoglycidilester or the like. In this case, it is required that carboxyl group necessary for performing an alkaline developing operation is left in the copolymer.

Epoxy compound having respective one of the aforesaid oxicilane ring and reactive double-bond is reacted with material having a reactive double-bond fed through unsaturated alcohol of the copolymer (b) attained as described above so as to increase a concentration of the reactive double-bond and then a copolymer having an increased concentration of the reactive double-bond (hereinafter called as a "copolymer (c)") can be manufactured.

Polymer having carboxy group other than styrene/maleic acid copolymer can also attain a reactive double-bond in the same manner as described above. Applying of the reactive double-bond to the copolymer is preferable in view of a photosensitivity. Synthesis of these copolymers (copolymer (a), copolymer (b), copolymer (c) and the like) can be performed in accordance with the methods described in the gazettes of Japanese Patent Publication Numbers 1972(47)-25470, 1973(48)-85679 and 1976(51)-21572.

[Chemical Formula 6] indicates vinylpyrrolidone/dimethylaminoethylmethacrylate copolymers.

[Chemical Formula 7] indicates vinylpyrrolidone/caprolactam/dimethylaminoethylmethacrylate terpolymers.

[Chemical Formula 8] indicates polyvinylformal. Polyvinyl formal resin can be attained as product by a method wherein vinyl acetate monomer is polymerized through catalyst to make polyvinyl acetate, then polyvinyl acetate is dissoluted in acetic acid, then formaldehyde and sulfuric acid are added to it to perform both saponification (alkaline hydrolysis) and formal reaction concurrently, dilute sulfuric acid are added to it to cause polyvinyl formal resin to be settled, and it is further processed through solvent recovering, washing and drying steps.

Polyvinyl formal resin is composed of polyvinyl formal group, polyvinyl alcohol group and polyvinyl acetate group and has a superior electrical insulating characteristic.

[Terepenephenol resin and alkyl phenolic resin are not indicated in chemical formula.]

Terepenephenol resin and alkylphenol resin are products manufactured by Arakawa Chemical Industry Ltd. As terepenephenol resin, product names of Tamanor 803L, 901 can be used and as alkylphenol resin, product names of Tamanor 520S, 521, 526, 586 and 572S can be used.

[Chemical Formula 9] indicates melamine/formaldehyde resin.

Melamine/formaldehyde resin is made by reacting melamine (C3H6N6) and formaldehyde. This synthetic reaction is not complete and non-reacted formaldehyde is left.

[Chemical Formula 10] indicates polyvinyl acetate.

Polyvinyl acetate is polymer compound made by polymerizing vinyl acetate, and for example, Sacnor SN-09T (product name) manufactured by Denki Kagaku Kogyo Kabushiki Kaisha can be used. Polyvinyl acetate has a structure indicated in the following chemical formula which is solid having white to light yellow in color not dissoluted in water, but soluble in alcohol type, acetic ester type and aromatic type solvent.

[Chemical Formula 11] and [Chemical Formula 12] indicate ketone resin.

As ketone resin, any one of methyl ethyl ketone, methyl isobutyl ketone, acetophenon, cyclohexanone, methylcyclohexanon may be applied. In this case, it is preferable to apply cyclohexanon indicated in Chemical Formula 11 and acetophenon indicated in Chemical Formula 12.

[Embodiments and Comparative Examples]

[Developing Latitude of Positive-Type Photosensitive Composition of the Present Invention]

In Table 1 to Table 10 are indicated some results of embodiments where the photogravure plate making was carried out under the plate making process described under application of these positive-type photosensitive compositions.

Following four types of positive-type photosensitive composition used in the embodiments in Table 1 to Table 10 and the comparative example in Table 11 were made as undiluted water. % values in Table 1 to Table 11 are weight % in respect to solid substance.

(a) Undiluted Solution A:

This is composed of novolac resin and phthalocyanine pigment having absorbing band at a part or entire infrared range with a wavelength of 700 to 1,100 nm, absorbing laser beam and attaining thermolysis.

As this novolac resin, polycondensation substance composed of mixed phenols of m-cresol, p-cresol, 2, 5-xylenol, 3,5-xylenol and resorcinol, and formaldehyde was used.

(b) Undiluted Solution B:

This is diluted solution composed of resol resin and the aforesaid phthalocyanine pigment.

(c) Undiluted Solution C:

This is undiluted solution composed of polyvinylphenol resin and the aforesaid phthalocyanine pigment.

(d) Undiluted Solution D:

This is undiluted solution composed of copolymer of acrylic acid derivatives having phenolic hydroxy group, and phthalocyanine pigment.

Embodiments and comparative examples were carried out such that roll base material in all these examples is iron, a photogravure plated roll with a diameter of φ200 mm plated with copper sulfateandmirror ground is chucked at both ends in a fountain coating device (a dehumidifying device and a humidifying device are installed there to enable a humidity to be controlled as desired) where solvent in the positive-typephotosensitive composition is evaporated during coating operation and a rate of the solvent in it is prevented from being changed, the roll is rotated at a speed of 25 r.p.m., the roll is sufficiently wiped with a wiping cloth, then a pipe for springing out test photosensitive liquid having positive-type photosensitive composition thinned to a predetermined concentration by solvent (MEK) at its upper end is positioned at one end of the photogravure plated roll to have a gap of about 500 μm, the test photosensitive liquid is sprung out only by anamount required for the coating operation, the pipe is moved from one end of the photogravure plated roll to the other end to make a uniform a coating of the test photosensitive liquid by a spiral scan system and its rotation is continued at 25 r.p.m. for 5 minute upon completion of coating operation, and then its rotation is stopped. After this period, it took 5 minute and liquid dripped state was observed and occurrence of liquid dripping could not be observed with naked eyes. Then, upon measurement of a film thickness, it showed that there was no difference at a lower surface of the roll and an upper surface of the roll. Thus, it was confirmed that the photosensitive film dried not to produce any liquid dripping could be set.

Subsequently, the test roll was rotated at 100 r.p.m. for 10 minute, stopped and a concentration of residual. solvent in the photosensitive film was measured to show 2.9%.

Subsequently, the test roll was fixed to the infrared laser-exposing device 7 (manufactured by Think Laboratory Co., Ltd.) having a high output semiconductor laser head manufactured by Creo-Scitex Corporation, laser of infrared wavelength range was radiated against the test roll, the developing tank was raised, the developing operation was carried out for about 60 to 70 second until the residual is eliminated and then the roll was washed with water.

Cutting at an edge of the resist image, residue, surface state of the resist and its hardness were observed by a microscope to judge a printing sensitivity, better or poor state of developing and developing latitude.

As to these positive-type photosensitive compositions, the coated film was formed at the photogravure-plated roll, the roll was fixed to the developing device under non-heated condition, the roll was rotated, the developing tank was raised, developing operation was carried out for about 60 to 70 second until the residue is eliminated, then the roll was washed with water, cutting at an edge of the resist image, residue, surface state of the resist and its hardness were observed by a microscope to judge a printing sensitivity, better or poor state of developing, film reduction and developing latitude.

Although the image line part exposed by alkaline developing liquid was washed away and the non-image line part not exposed by alkaline developing liquid produced a film reduction, the experiment confirmed that the roll has a developing latitude where a sharp pattern is left and is not washed away.

TABLE 1

| | Type of undiluted solution of positive type photo-sensitive composition | Type and inclution rate of close auxiliary agent | Rate of solid element in developing promoting agent | Burning temperature No burning | Humidity | Cloth fitness |
|---|---|---|---|---|---|---|
| Embodiment 1 | undiluted solution A | PVP/VA Copolymer 2% | None | 25° C. No burning | 25% | Excellent |
| Embodiment 2 | undiluted solution A | PVP/VA Copolymer 2.5% | None | 25° C. No burning | 30% | Excellent |
| Embodiment 3 | undiluted solution A | PVP/VA Copolymer 3% | None | 25° C. No burning | 55% | Excellent |
| Embodiment 4 | undiluted solution A | PVP/VA Copolymer 4% | None | 25° C. No burning | 60% | Excellent |
| Embodiment 5 | undiluted solution B | PVP/VA Copolymer 2% | None | 25° C. No burning | 25% | Excellent |

TABLE 1-continued

| | Type of undiluted solution of positive type photo-sensitive composition | Type and inclution rate of close auxiliary agent | Rate of solid element in developing promoting agent | Burning temperature No burning | Humidity | Cloth fitness |
|---|---|---|---|---|---|---|
| Embodiment 6 | undiluted solution B | PVP/VA Copolymer 2.5% | None | 25° C. No burning | 30% | Excellent |
| Embodiment 7 | undiluted solution B | PVP/VA Copolymer 3% | None | 25° C. No burning | 55% | Excellent |
| Embodiment 8 | undiluted solution B | PVP/VA Copolymer 4% | None | 25° C. No burning | 60% | Excellent |
| Embodiment 9 | undiluted solution C | PVP/VA Copolymer 2% | None | 25° C. No burning | 25% | Excellent |
| Embodiment 10 | undiluted solution C | PVP/VA Copolymer 2.5% | None | 25° C. No burning | 30% | Excellent |
| Embodiment 11 | undiluted solution C | PVP/VA Copolymer 3% | None | 25° C. No burning | 55% | Excellent |
| Embodiment 12 | undiluted solution C | PVP/VA Copolymer 4% | None | 25° C. No burning | 60% | Excellent |

TABLE 2

| | Type of undiluted solution of positive type photo-sensitive composition | Type and inclution rate of close auxiliary agent | Rate of solid element in developing promoting agent | Burning temperature No buning | Humidity | Cloth fitness |
|---|---|---|---|---|---|---|
| Embodiment 13 | undiluted solution A | Polyvinyl butyral 2% | None | 25° C. No burning | 25% | Excellent |
| Embodiment 14 | undiluted solution A | Polyvinyl butyral 2.5% | None | 25° C. No burning | 30% | Excellent |
| Embodiment 15 | undiluted solution A | Polyvinyl butyral 3% | None | 25° C. No burning | 55% | Excellent |
| Embodiment 16 | undiluted solution A | Polyvinyl butyral 4% | None | 25° C. No burning | 60% | Excellent |
| Embodiment 17 | undiluted solution B | Polyvinyl butyral 2% | None | 25° C. No burning | 25% | Excellent |
| Embodiment 18 | undiluted solution B | Polyvinyl butyral 2.5% | None | 25° C. No burning | 30% | Excellent |
| Embodiment 19 | undiluted solution B | Polyvinyl butyral 3% | None | 25° C. No burning | 55% | Excellent |
| Embodiment 20 | undiluted solution B | Polyvinyl butyral 4% | None | 25° C. No burning | 60% | Excellent |
| Embodiment 21 | undiluted solution C | Polyvinyl butyral 2% | None | 25° C. No burning | 25% | Excellent |
| Embodiment 22 | undiluted solution C | Polyvinyl butyral 2.5% | None | 25° C. No burning | 30% | Excellent |
| Embodiment 23 | undiluted solution C | Polyvinyl butyral 3% | None | 25° C. No burning | 55% | Excellent |
| Embodiment 24 | undiluted solution C | Polyvinyl butyral 4% | None | 25° C. No burning | 60% | Excellent |

TABLE 3

| | Type of undiluted solution of positive type photo-sensitive composition | Type and inclution rate of close auxiliary agent | Rate of solid element in developing promoting agent | Burning temperature No buning | Humidity | Cloth fitness |
|---|---|---|---|---|---|---|
| Embodiment 25 | undiluted solution A | SM Type copolymer 2% | None | 25° C. No burning | 25% | Excellent |
| Embodiment 26 | undiluted solution A | SM Type copolymer 2.5% | None | 25° C. No burning | 30% | Excellent |
| Embodiment 27 | undiluted solution A | SM Type copolymer 3% | None | 25° C. No burning | 55% | Excellent |
| Embodiment 28 | undiluted solution A | SM Type copolymer 4% | None | 25° C. No burning | 60% | Excellent |
| Embodiment 29 | undiluted solution B | SM Type copolymer 2% | None | 25° C. No burning | 25% | Excellent |
| Embodiment 30 | undiluted solution B | SM Type copolymer 2.5% | None | 25° C. No burning | 30% | Excellent |
| Embodiment 31 | undiluted solution B | SM Type copolymer 3% | None | 25° C. No burning | 55% | Excellent |
| Embodiment 32 | undiluted solution B | SM Type copolymer 4% | None | 25° C. No burning | 60% | Excellent |
| Embodiment 33 | undiluted solution C | SM Type copolymer 2% | None | 25° C. No burning | 25% | Excellent |
| Embodiment 34 | undiluted solution C | SM Type copolymer 2.5% | None | 25° C. No burning | 30% | Excellent |
| Embodiment 35 | undiluted solution C | SM Type copolymer 3% | None | 25° C. No burning | 55% | Excellent |
| Embodiment 36 | undiluted solution C | SM Type copolymer 4% | None | 25° C. No burning | 60% | Excellent |

Note
SM type copolymer is styrene/maleic acid copolymer

TABLE 4

| | Type of undiluted solution of positive type photo-sensitive composition | Type and inclution rate of close auxiliary agent | Rate of solid element in developing promoting agent | Burning temperature No buning | Humidity | Cloth fitness |
|---|---|---|---|---|---|---|
| Embodiment 37 | undiluted solution A | vinyl pyrrolidone/ Dimethylamine ethylmethacrylate copolymer 2% | None | 25° C. No burning | 25% | Excellent |
| Embodiment 38 | undiluted solution A | vinyl pyrrolidone/ Dimethylamine ethylmethacrylate copolymer 2.5% | None | 25° C. No burning | 30% | Excellent |
| Embodiment 39 | undiluted solution A | vinyl pyrrolidone/ Dimethylamine ethylmethacrylate copolymer 3% | None | 25° C. No burning | 55% | Excellent |
| Embodiment 40 | undiluted solution A | vinyl pyrrolidone/ Dimethylamine ethylmethacrylate copolymer 4% | None | 25° C. No burning | 60% | Excellent |

TABLE 4-continued

| | Type of undiluted solution of positive type photo-sensitive composition | Type and inclution rate of close auxiliary agent | Rate of solid element in developing promoting agent | Burning temperature No buning | Humidity | Cloth fitness |
|---|---|---|---|---|---|---|
| Embodiment 41 | undiluted solution B | vinyl pyrrolidone/ Dimethylamine ethylmethacrylate copolymer 2% | None | 25° C. No burning | 25% | Excellent |
| Embodiment 42 | undiluted solution B | vinyl pyrrolidone/ Dimethylamine ethylmethacrylate copolymer 2.5% | None | 25° C. No burning | 30% | Excellent |
| Embodiment 43 | undiluted solution B | vinyl pyrrolidone/ Dimethylamine ethylmethacrylate copolymer 3% | None | 25° C. No burning | 55% | Excellent |
| Embodiment 44 | undiluted solution B | vinyl pyrrolidone/ Dimethylamine ethylmethacrylate copolymer 4% | None | 25° C. No burning | 60% | Excellent |
| Embodiment 45 | undiluted solution C | vinyl pyrrolidone/ Dimethylamine ethylmethacrylate copolymer 2% | None | 25° C. No burning | 25% | Excellent |
| Embodiment 46 | undiluted solution C | vinyl pyrrolidone/ Dimethylamine ethylmethacrylate copolymer 2.5% | None | 25° C. No burning | 30% | Excellent |
| Embodiment 47 | undiluted solution C | vinyl pyrrolidone/ Dimethylamine ethylmethacrylate copolymer 3% | None | 25° C. No burning | 55% | Excellent |
| Embodiment 48 | undiluted solution C | vinyl pyrrolidone/ Dimethylamine ethylmethacrylate copolymer 4% | None | 25° C. No burning | 60% | Excellent |

TABLE 5

| | Type of undiluted solution of positive type photo-sensitive composition | Type and inclution rate of close auxiliary agent | Rate of solid element in developing promoting agent | Burning temperature No buning | Humidity | Cloth fitness |
|---|---|---|---|---|---|---|
| Embodiment 49 | undiluted solution A | vinyl pyrrolidone/ Dimethylamine ethylmethacrylate Terpolymer 2% | None | 25° C. No burning | 25% | Excellent |
| Embodiment 50 | undiluted solution A | vinyl pyrrolidone/ Dimethylamine ethylmethacrylate Terpolymer 2.5% | None | 25° C. No burning | 30% | Excellent |
| Embodiment 51 | undiluted solution A | vinyl pyrrolidone/ Dimethylamine ethylmethacrylate Terpolymer 3% | None | 25° C. No burning | 55% | Excellent |

TABLE 5-continued

| | Type of undiluted solution of positive type photo-sensitive composition | Type and inclution rate of close auxiliary agent | Rate of solid element in developing promoting agent | Burning temperature No buning | Humidity | Cloth fitness |
|---|---|---|---|---|---|---|
| Embodiment 52 | undiluted solution A | vinyl pyrrolidone/ Dimethylamine ethylmethacrylate Terpolymer 4% | None | 25° C. No burning | 60% | Excellent |
| Embodiment 53 | undiluted solution B | vinyl pyrrolidone/ Dimethylamine ethylmethacrylate Terpolymer 2% | None | 25° C. No burning | 25% | Excellent |
| Embodiment 54 | undiluted solution B | vinyl pyrrolidone/ Dimethylamine ethylmethacrylate Terpolymer 2.5% | None | 25° C. No burning | 30% | Excellent |
| Embodiment 55 | undiluted solution B | vinyl pyrrolidone/ Dimethylamine ethylmethacrylate Terpolymer 3% | None | 25° C. No burning | 55% | Excellent |
| Embodiment 56 | undiluted solution B | vinyl pyrrolidone/ Dimethylamine ethylmethacrylate Terpolymer 4% | None | 25° C. No burning | 60% | Excellent |
| Embodiment 57 | undiluted solution C | vinyl pyrrolidone/ Dimethylamine ethylmethacrylate Terpolymer 2% | None | 25° C. No burning | 25% | Excellent |
| Embodiment 58 | undiluted solution C | vinyl pyrrolidone/ Dimethylamine ethylmethacrylate Terpolymer 2.5% | None | 25° C. No burning | 30% | Excellent |
| Embodiment 59 | undiluted solution C | vinyl pyrrolidone/ Dimethylamine ethylmethacrylate Terpolymer 3% | None | 25° C. No burning | 55% | Excellent |
| Embodiment 60 | undiluted solution C | vinyl pyrrolidone/ Dimethylamine ethylmethacrylate Terpolymer 4% | None | 25° C. No burning | 60% | Excellent |

TABLE 6

| | Type of undiluted solution of positive type photo-sensitive composition | Type and inclution rate of close auxiliary agent | Rate of solid element in developing promoting agent | Burning temperature No buning | Humidity | Cloth fitness |
|---|---|---|---|---|---|---|
| Embodiment 61 | undiluted solution A | polyvinyl formal 2% | None | 25° C. No burning | 25% | Excellent |
| Embodiment 62 | undiluted solution A | polyvinyl formal 2.5% | None | 25° C. No burning | 30% | Excellent |
| Embodiment 63 | undiluted solution A | polyvinyl formal 3% | None | 25° C. No burning | 55% | Excellent |
| Embodiment 64 | undiluted solution A | polyvinyl formal 4% | None | 25° C. No burning | 60% | Excellent |

TABLE 6-continued

| | Type of undiluted solution of positive type photo-sensitive composition | Type and inclution rate of close auxiliary agent | Rate of solid element in developing promoting agent | Burning temperature No buning | Humidity | Cloth fitness |
|---|---|---|---|---|---|---|
| Embodiment 65 | undiluted solution B | polyvinyl formal 2% | None | 25° C. No burning | 25% | Excellent |
| Embodiment 66 | undiluted solution B | polyvinyl formal 2.5% | None | 25° C. No burning | 30% | Excellent |
| Embodiment 67 | undiluted solution B | polyvinyl formal 3% | None | 25° C. No burning | 55% | Excellent |
| Embodiment 68 | undiluted solution B | polyvinyl formal 4% | None | 25° C. No burning | 60% | Excellent |
| Embodiment 69 | undiluted solution C | polyvinyl formal 2% | None | 25° C. No burning | 25% | Excellent |
| Embodiment 70 | undiluted solution C | polyvinyl formal 2.5% | None | 25° C. No burning | 30% | Excellent |
| Embodiment 71 | undiluted solution C | polyvinyl formal 3% | None | 25° C. No burning | 55% | Excellent |
| Embodiment 72 | undiluted solution C | polyvinyl formal 4% | None | 25° C. No burning | 60% | Excellent |

TABLE 7

| | Type of undiluted solution of positive type photo-sensitive composition | Type and inclution rate of close auxiliary agent | Rate of solid element in developing promoting agent | Burning temperature No buning | Humidity | Cloth fitness |
|---|---|---|---|---|---|---|
| Embodiment 73 | undiluted solution A | TAMANOR803L 2% | None | 25° C. No burning | 25% | Excellent |
| Embodiment 74 | undiluted solution A | TAMANOR803L 2.5% | None | 25° C. No burning | 30% | Excellent |
| Embodiment 75 | undiluted solution A | TAMANOR803L 3% | None | 25° C. No burning | 55% | Excellent |
| Embodiment 76 | undiluted solution A | TAMANOR803L 4% | None | 25° C. No burning | 60% | Excellent |
| Embodiment 77 | undiluted solution B | TAMANOR803L 2% | None | 25° C. No burning | 25% | Excellent |
| Embodiment 78 | undiluted solution B | TAMANOR803L 2.5% | None | 25° C. No burning | 30% | Excellent |
| Embodiment 79 | undiluted solution B | TAMANOR803L 3% | None | 25° C. No burning | 55% | Excellent |
| Embodiment 80 | undiluted solution B | TAMANOR803L 4% | None | 25° C. No burning | 60% | Excellent |
| Embodiment 81 | undiluted solution C | TAMANOR803L 2% | None | 25° C. No burning | 25% | Excellent |
| Embodiment 82 | undiluted solution C | TAMANOR803L 2.5% | None | 25° C. No burning | 30% | Excellent |
| Embodiment 83 | undiluted solution C | TAMANOR803L 3% | None | 25° C. No burning | 55% | Excellent |

TABLE 7-continued

| | Type of undiluted solution of positive type photo-sensitive composition | Type and inclution rate of close auxiliary agent | Rate of solid element in developing promoting agent | Burning temperature No buning | Humidity | Cloth fitness |
|---|---|---|---|---|---|---|
| Embodiment 84 | undiluted solution C | TAMANOR803L 4% | None | 25° C. No burning | 60% | Excellent |

Note
TAMANOR803L is a goods name of terpenephenol resin manufactured by Arakawa Chemical Industry Ltd.

TABLE 8

| | Type of undiluted solution of positive type photo-sensitive composition | Type and inclution rate of close auxiliary agent | Rate of solid element in developing promoting agent | Burning temperature No buning | Humidity | Cloth fitness |
|---|---|---|---|---|---|---|
| Embodiment 85 | undiluted solution A | TAMANOR520S 2% | None | 25° C. No burning | 25% | Excellent |
| Embodiment 86 | undiluted solution A | TAMANOR520S 2.5% | None | 25° C. No burning | 30% | Excellent |
| Embodiment 87 | undiluted solution A | TAMANOR520S 3% | None | 25° C. No burning | 55% | Excellent |
| Embodiment 88 | undiluted solution A | TAMANOR520S 4% | None | 25° C. No burning | 60% | Excellent |
| Embodiment 89 | undiluted solution B | TAMANOR520S 2% | None | 25° C. No burning | 25% | Excellent |
| Embodiment 90 | undiluted solution B | TAMANOR520S 2.5% | None | 25° C. No burning | 30% | Excellent |
| Embodiment 91 | undiluted solution B | TAMANOR520S 3% | None | 25° C. No burning | 55% | Excellent |
| Embodiment 92 | undiluted solution B | TAMANOR520S 4% | None | 25° C. No burning | 60% | Excellent |
| Embodiment 93 | undiluted solution C | TAMANOR520S 2% | None | 25° C. No burning | 25% | Excellent |
| Embodiment 94 | undiluted solution C | TAMANOR520S 2.5% | None | 25° C. No burning | 30% | Excellent |
| Embodiment 95 | undiluted solution C | TAMANOR520S 3% | None | 25° C. No burning | 55% | Excellent |
| Embodiment 96 | undiluted solution C | TAMANOR520S 4% | None | 25° C. No burning | 60% | Excellent |

Note
TAMANOR526 and TAMANOR572S are alkylphenol rein manufactured by Arakawa Chemical Industry Ltd.

TABLE 9

| | Type of undiluted solution of positive type photo-sensitive composition | Type and inclution rate of close auxiliary agent | Rate of solid element in developing promoting agent | Burning temperature No buning | Humidity | Cloth fitness |
|---|---|---|---|---|---|---|
| Embodiment 97 | undiluted solution A | Polyvinyl acetate 2% | None | 25° C. No burning | 25% | Excellent |
| Embodiment 98 | undiluted solution A | Polyvinyl acetate 2.5% | None | 25° C. No burning | 30% | Excellent |
| Embodiment 99 | undiluted solution A | Polyvinyl acetate 3% | None | 25° C. No burning | 55% | Excellent |
| Embodiment 100 | undiluted solution A | Polyvinyl acetate 4% | None | 25° C. No burning | 60% | Excellent |
| Embodiment 101 | undiluted solution B | Polyvinyl acetate 2% | None | 25° C. No burning | 25% | Excellent |
| Embodiment 102 | undiluted solution B | Polyvinyl acetate 2.5% | None | 25° C. No burning | 30% | Excellent |
| Embodiment 103 | undiluted solution B | Polyvinyl acetate 3% | None | 25° C. No burning | 55% | Excellent |
| Embodiment 104 | undiluted solution B | Polyvinyl acetate 4% | None | 25° C. No burning | 60% | Excellent |
| Embodiment 105 | undiluted solution C | Polyvinyl acetate 2% | None | 25° C. No burning | 25% | Excellent |
| Embodiment 106 | undiluted solution C | Polyvinyl acetate 2.5% | None | 25° C. No burning | 30% | Excellent |
| Embodiment 107 | undiluted solution C | Polyvinyl acetate 3% | None | 25° C. No burning | 55% | Excellent |
| Embodiment 108 | undiluted solution C | Polyvinyl acetate 4% | None | 25° C. No burning | 60% | Excellent |

TABLE 10

| | Type of undiluted solution of positive type photo-sensitive composition | Type and inclution rate of close auxiliary agent | Rate of solid element in developing promoting agent | Burning temperature No buning | Humidity | Cloth fitness |
|---|---|---|---|---|---|---|
| Embodiment 109 | undiluted solution A | Cyclohexane reain 2% | None | 25° C. No burning | 25% | Excellent |
| Embodiment 110 | undiluted solution A | Cyclohexane reain 2.5% | None | 25° C. No burning | 30% | Excellent |
| Embodiment 111 | undiluted solution A | Cyclohexane reain 3% | None | 25° C. No burning | 55% | Excellent |
| Embodiment 112 | undiluted solution A | Cyclohexane reain 4% | None | 25° C. No burning | 60% | Excellent |
| Embodiment 113 | undiluted solution B | Cyclohexane reain 2% | None | 25° C. No burning | 25% | Excellent |
| Embodiment 114 | undiluted solution B | Cyclohexane reain 2.5% | None | 25° C. No burning | 30% | Excellent |
| Embodiment 115 | undiluted solution B | Cyclohexane reain 3% | None | 25° C. No burning | 55% | Excellent |

TABLE 10-continued

| | Type of undiluted solution of positive type photo-sensitive composition | Type and inclution rate of close auxiliary agent | Rate of solid element in developing promoting agent | Burning temperature No buning | Humidity | Cloth fitness |
|---|---|---|---|---|---|---|
| Embodiment 116 | undiluted solution B | Cyclohexane reain 4% | None | 25° C. No burning | 60% | Excellent |
| Embodiment 117 | undiluted solution C | Cyclohexane reain 2% | None | 25° C. No burning | 25% | Excellent |
| Embodiment 118 | undiluted solution C | Cyclohexane reain 2.5% | None | 25° C. No burning | 30% | Excellent |
| Embodiment 119 | undiluted solution C | Cyclohexane reain 3% | None | 25° C. No burning | 55% | Excellent |
| Embodiment 120 | undiluted solution C | Cyclohexane reain 4% | None | 25° C. No burning | 60% | Excellent |
| Embodiment 121 | undiluted solution A | Cyclohexane reain 2% | None | 25° C. No burning | 25% | Excellent |
| Embodiment 122 | undiluted solution A | Cyclohexane reain 2.5% | None | 25° C. No burning | 30% | Excellent |
| Embodiment 123 | undiluted solution A | Cyclohexane reain 3% | None | 25° C. No burning | 55% | Excellent |
| Embodiment 124 | undiluted solution A | Cyclohexane reain 4% | None | 25° C. No burning | 60% | Excellent |
| Embodiment 125 | undiluted solution B | Cyclohexane reain 2% | None | 25° C. No burning | 25% | Excellent |
| Embodiment 126 | undiluted solution B | Cyclohexane reain 2.5% | None | 25° C. No burning | 30% | Excellent |
| Embodiment 127 | undiluted solution B | Cyclohexane reain 3% | None | 25° C. No burning | 55% | Excellent |
| Embodiment 128 | undiluted solution B | Cyclohexane reain 4% | None | 25° C. No burning | 60% | Excellent |
| Embodiment 129 | undiluted solution C | Cyclohexane reain 2% | None | 25° C. No burning | 25% | Excellent |
| Embodiment 130 | undiluted solution C | Cyclohexane reain 2.5% | None | 25° C. No burning | 30% | Excellent |
| Embodiment 131 | undiluted solution C | Cyclohexane reain 3% | None | 25° C. No burning | 55% | Excellent |
| Embodiment 132 | undiluted solution C | Cyclohexane reain 4% | None | 25° C. No burning | 60% | Excellent |

As described above, the fact that the positive-type photosensitive composition not including vinylpyrrolidone/dimethylaminoethylmethacrylate copolymers or polyvinylbutyral and the like does not produce any developing latitude, but the positive-type photosensitive composition including vinylpyrrolidone/dimethylaminoethylmethacrylate copolymers or polyvinylbutyral and the like produces any developing latitude shows that strong adhesion of vinylpyrrolidone/dimethylaminoethylmethacrylate copolymers or polyvinylbutyral and the like properly reinforces weak adhesion of alkaline soluble organic polymer substance having a phenolic hydroxy group and becomes a cause for producing a developing latitude.

Developing Latitude of Comparative Examples

As shown in Table 11, a burning temperature at the photosensitive film of the positive-type photosensitive composition having titanium organic compound added to undiluted solution of the positive-type photosensitive composition composed of alkaline soluble organic polymer substance with phenolic hydroxy group and phthalocyanine pigment could be remarkably decreased.

In the case of the photosensitive film of the positive-type photosensitive composition added with titanium organic compound, the film could be formed well even under a buring temperature of 46° C., its sensitivity became superior and the developing operation could be easily carried out.

However, the test not performing any burning processing could not produce any superior film and the developing became poor.

TABLE 11

| | Type of undiluted solution of positive type pho-tosensitive compo-sition | Type and inclution rate of close auxiliary agent | Rate of solid element in de-veloping promoting agent | Burning temper-ature No buning | Cloth fitness |
|---|---|---|---|---|---|
| Comparative Example 1 | undiluted solution A | Orgatex TA-10 1% | 46° C. | None | Excellent |
| Comparative Example 2 | undiluted solution A | Orgatex TA-25 1% | 46° C. | None | Excellent |
| Comparative Example 3 | undiluted solution A | Orgatex TA-22 1% | 46° C. | None | Excellent |
| Comparative Example 4 | undiluted solution A | Orgatex TPHS 1% | 46° C. | None | Excellent |
| Comparative Example 5 | undiluted solution A | Orgatex TA-100 1% | 46° C. | None | Excellent |
| Comparative Example 6 | undiluted solution B | Orgatex TA-10 1% | 46° C. | None | Excellent |
| Comparative Example 7 | undiluted solution B | Orgatex TA-25 1% | 46° C. | None | Excellent |
| Comparative Example 8 | undiluted solution B | Orgatex TA-100 1% | 46° C. | None | Excellent |
| Comparative Example 9 | undiluted solution C | Orgatex TA-10 1% | 46° C. | None | Excellent |
| Comparative Example 10 | undiluted solution C | Orgatex TA-25 1% | 46° C. | None | Excellent |
| Comparative Example 11 | undiluted solution C | Orgatex TA-100 1% | 46° C. | None | Excellent |
| Comparative Example 12 | undiluted solution D | Orgatex TA-10 1% | 46° C. | None | Excellent |
| Comparative Example 13 | undiluted solution D | Orgatex TA-25 1% | 46° C. | None | Excellent |
| Comparative Example 14 | undiluted solution D | Orgatex TA-100 1% | 46° C. | None | Excellent |
| Comparative Example 15 | undiluted solution A | Orgatex TA-10 1% | 25° C. No burning | None | Poor |
| Comparative Example 16 | undiluted solution A | Orgatex TA-25 1% | 25° C. No burning | None | Poor |
| Comparative Example 17 | undiluted solution B | Orgatex TA-10 1% | 25° C. No burning | None | Poor |
| Comparative Example 18 | undiluted solution B | Orgatex TA-25 1% | 25° C. No burning | None | Poor |
| Comparative Example 19 | undiluted solution C | Orgatex TA-10 1% | 25° C. No burning | None | Poor |
| Comparative Example 20 | undiluted solution C | Orgatex TA-25 1% | 25° C. No burning | None | Poor |
| Comparative Example 21 | undiluted solution D | Orgatex TA-10 1% | 25° C. No burning | None | Poor |
| Comparative Example 22 | undiluted solution D | Orgatex TA-25 1% | 25° C. No burning | None | Poor |

Note
Orgatex is a products name of titanium organic compound manufactured by Arakawa Chemical Industry Ltd.
Orgatex TA-10 is tetraisopropyltitanite.
Orgatex TA-25 is tetranormaltitanite.
Orgatex TA-100 is tetaniumacetylacetonate.
Orgatex TPHS is polyhydroxytitaniumsterate.

In reference to the aforesaid results, the following effects can be attained in the photogravure plate making method when the positive-type photosensitive composition not requiring any burning operation after coating is used:

(1) Burning after coating of a photogravure-plated item is not suitable and it has a characteristic capable of attaining a requisite and sufficient adhesion state even if the burning is not carried out. A photosensitive film having luster and quite hard state can be attained.

(2) A requisite and sufficient adhesion can be attained when the coating is carried out on a fine day showing a humidity of about 25 to 60% in a working room, or the coating is carried out with a humidity of about 25 to 60% in the working room under application of the dehumidifying device and the humidifying device.

(3) A superior alkaline developing not producing any residuals can be carried out in a suitable time. Irrespective of the fact that the component at the photosensitive layer does not produce substantially any chemical change by exposure, all the basic performances of a printing plate such as an plate wear characteristic, sensitivity and developing latitude or the like can be satisfied.

(4) Even if the image exposure is carried out with a lower exposure energy rather than with a higher exposure energy in which excessive heat is generated by the photo-thermal conversion substance in the photosensitive layer, the developing latitude can be set wide, so that a degree of dispersion generated at the photosensitive layer is well restricted low and there occurs no problem that the photosensitive layer is dispersed and the optical system in the exposure device is contaminated.

(5) No burning processing enables a quite superior developing to be carried out where a high sensitivity can be kept, and an edge of the resist image is cut in a sharp contour strictly in accordance with an exposure radiation pattern.

(6) A quite superior developing can be carried out while a film reduction is scarcely produced. It is possible to avoid occurrence of pinholes caused by film reduction.

(7) The resist image has a luster, a quite hard resist image capable of printing several thousand copies can be attained during printing as it is, and anti-scar characteristic in handling before developing operation after forming the photosensitive film is improved.

(8) A printing of image with laser and developing latitude are superior.

What is claimed is:

1. A photogravure printing plate precursor comprising (A) a photogravure plated roll, and (B) a positive-type photosensitive composition for photogravure printing consisting of novolac resin, resol resin, polyvinyl phenolic resin or copolymer of acrylic acid derivative having phenolic hydroxyl group, and a phthalocyanine pigment or a cyanine pigment, said pigment having an absorbing region at a part of or an entire infrared wavelength range, having a characteristic for absorbing laser beam in the infrared wavelength region to perform a thermolysis, and any one of adherence characteristic reforming agents selected from the group consisting of (1) vinyl pyrrolidone/vinylacetate copolymers, (2) polyvinylbutyral, (3) styrene/maleic acid copolymers, (4) vinylpyrrolidone/dimethylaminoethylmethacrylate copolymers, (5) terpolymers of vinylpyrrolidone/vinylcaprolactam/dimethylaminoethyl methacrylate, (6) terpenephenolic resin, (7) alkylphenolic resin, (8) polyvinylformal resin, (9) melamine/formaldehyde resin,

(10) polyvinyl acetate, and

(11) ketone resin, wherein the positive-type photosensitive composition is coated on the photogravure plated roll.

2. A method for making a photogravure plate, said method comprising the steps of:

(A) coating a positive-type photosensitive composition on a photogravure plated roll to form a positive-type photosensitve film, wherein positive-type photosensitive composition comprises:

(i) novolac resin, resol resin, polyvinyl phenolic resin or copolymer of acrylic acid derivative having phenolic hydroxyl group, (ii) a phthalocyanine pigment or a cyanine pigment, said pigment having an absorbing region at a part of or an entire infrared wavelength range, having a characteristic for absorbing laser beam in the infrared wavelength region to perform a thermolysis, and (iii) any one of adherence characteristic reforming agents selected from the groups consisting of (a) vinyl pyrrolidone/vinylacetate copolymers, (b) polyvinylbutyral, (c) styrene/maleic acid copolymers, (d) vinylpyrrolidone/dimethylaminoethylmethacrylate copolymers, (e) terpolymers of vinylpyrrolidone/vinylcaprolactani/dimethylamino ethyl methacrylate, (f) terpenephenolic resin, (g) alkylphenolic resin, (h) polyvinylformal resin, (i) melamine/formaldehyde resin, (j) polyvinyl acetate, and (k) ketone resin, (B) exposing an image at the positive-type photosensitive film with a laser of infrared wavelength range, and (C) developing the positive-type photosensitive film with alkaline developing liquid without burning after the coating step.

* * * * *